United States Patent
Hoshiba et al.

[11] Patent Number: 5,803,339
[45] Date of Patent: Sep. 8, 1998

[54] PROCESS AND APPARATUS FOR FORMING BALL BUMPS

[75] Inventors: Hiroshi Hoshiba; Kohei Tatsumi, both of Kanagawa; Masashi Konda; Yoji Kawakami, both of Tokyo, all of Japan

[73] Assignee: Nippon Steel Corporation, Tokyo, Japan

[21] Appl. No.: 845,823

[22] Filed: Apr. 28, 1997

Related U.S. Application Data

[62] Division of Ser. No. 557,943, Nov. 14, 1995, Pat. No. 5,687,901.

[51] Int. Cl.$^6$ .................................................. H01L 21/60
[52] U.S. Cl. ............................................ 228/41; 221/204
[58] Field of Search .............................. 228/6.2, 41, 49.5, 228/246, 254; 156/580.1, 73.1, 267; 221/200, 204; 438/613, 615; 427/96; 118/213

[56] References Cited

U.S. PATENT DOCUMENTS

| | | | |
|---|---|---|---|
| 5,279,045 | 1/1994 | Odashima et al. | 228/41 |
| 5,410,807 | 5/1995 | Bross et al. | 228/179.1 |
| 5,657,528 | 8/1997 | Sakemi et al. | 228/41 |
| 5,695,667 | 12/1997 | Eguchi et al. | 228/254 |

FOREIGN PATENT DOCUMENTS

| | | |
|---|---|---|
| 0 427 384 A2 | 5/1991 | European Pat. Off. . |
| 5-259224 | 10/1993 | Japan . |
| 6-344132 | 12/1994 | Japan . |

*Primary Examiner*—Samuel M. Heinrich
*Attorney, Agent, or Firm*—Pollock, Vande Sande & Priddy

[57] ABSTRACT

A process of forming ball bumps for electrical connection to an integrated circuit, the process comprising the steps of: applying a vibration at a small amplitude to a vessel containing small balls of an electroconductive material to cause the small balls to jump up above the vessel; holding and arranging the small balls on an arrangement baseplate by attracting the jumping up small balls to attraction openings provided in the arrangement baseplate in positions corresponding to positions of at least one set of the electrode pads of one semiconductor chip; removing excess small balls adhered either to the arrangement baseplate or to the small balls attracted to the openings; and simultaneously bonding the small balls held and arranged on the arrangement baseplate to bonding spots arranged in positions corresponding to said positions of said at least one set of the electrode pads.

30 Claims, 34 Drawing Sheets

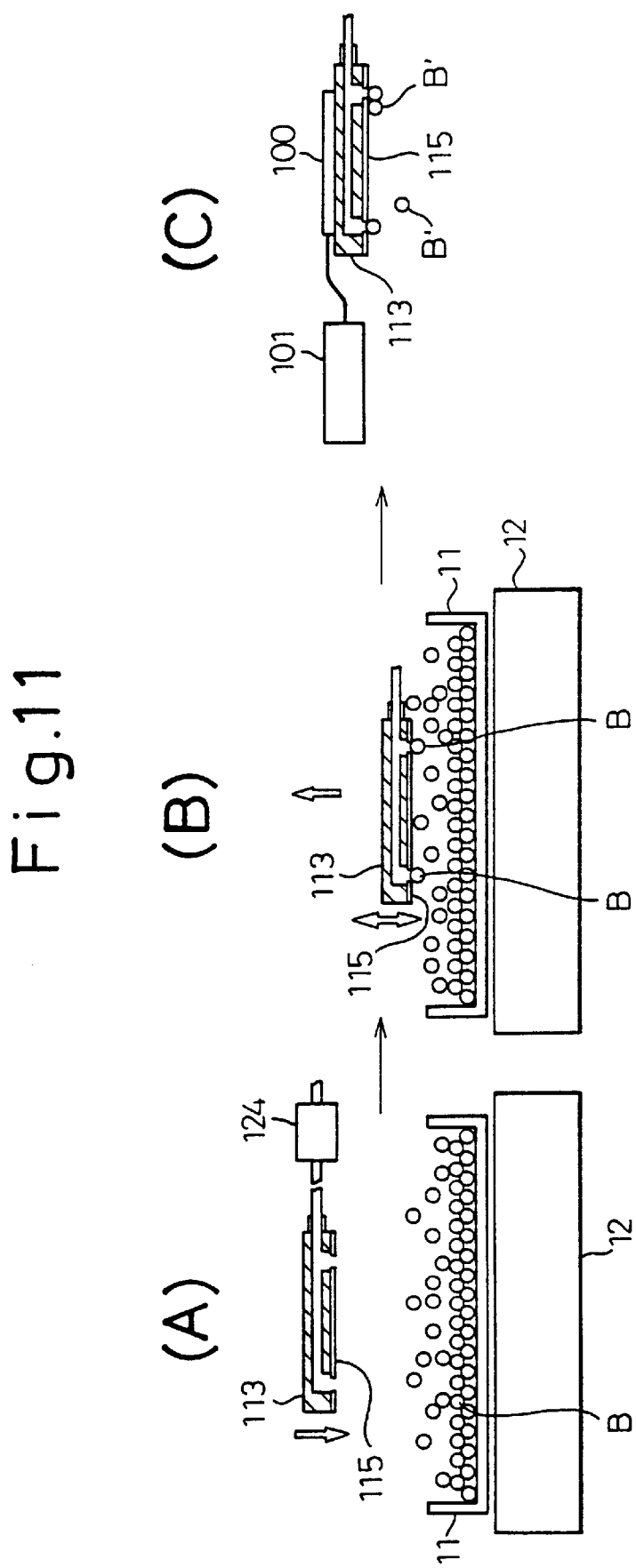

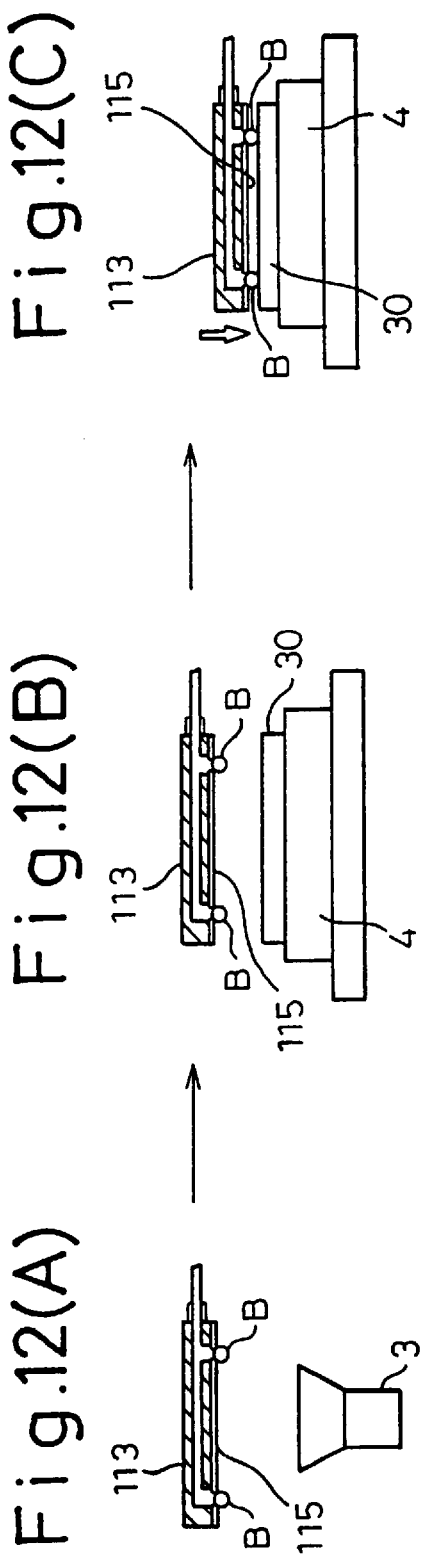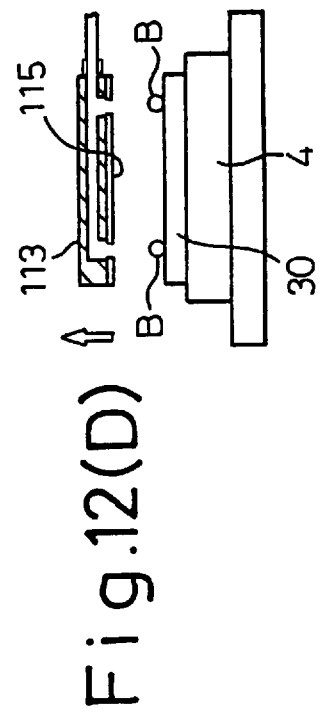

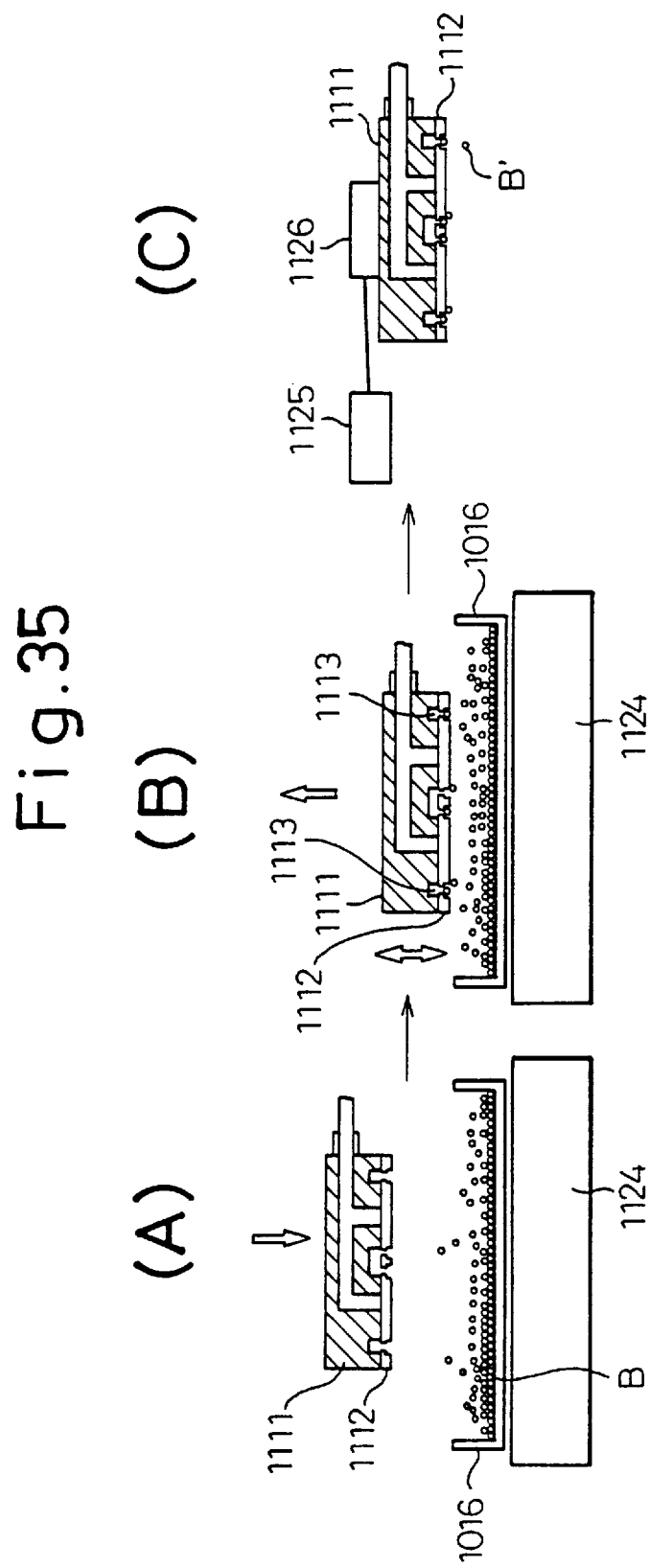

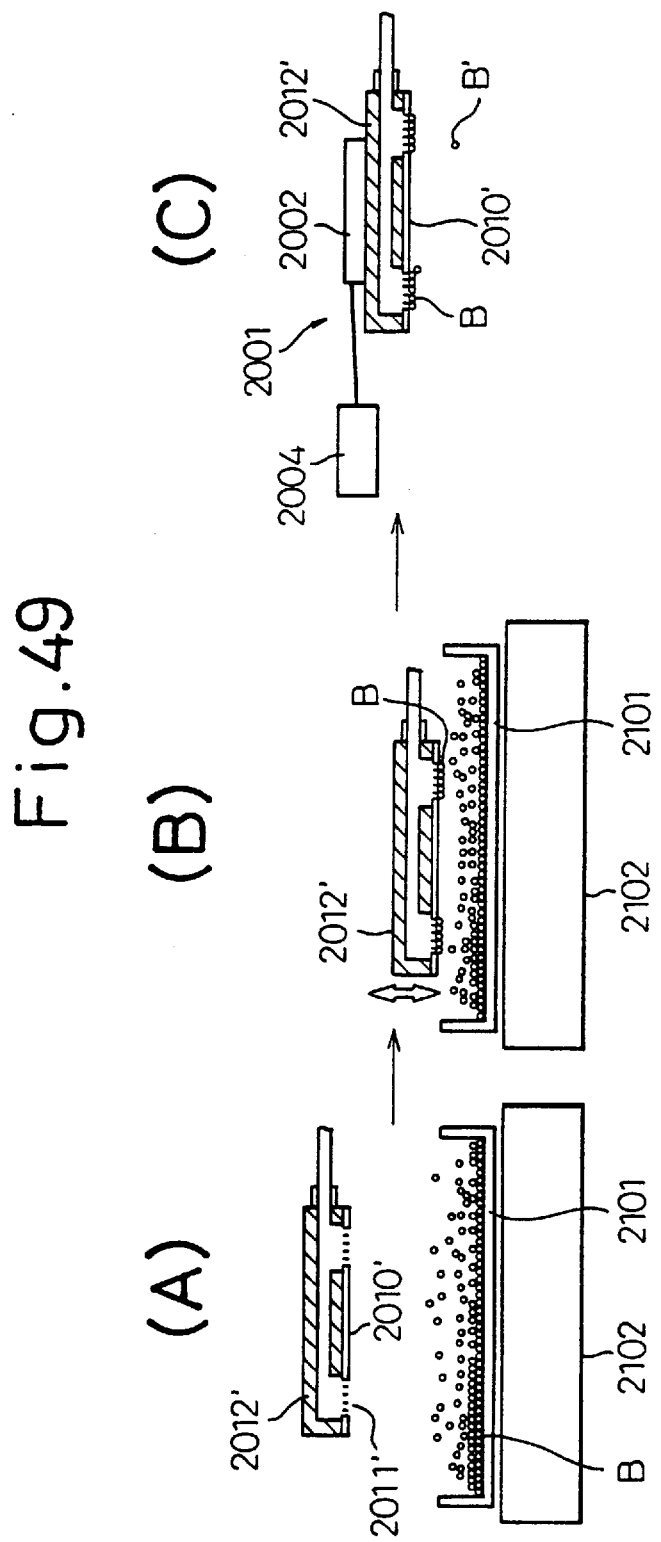

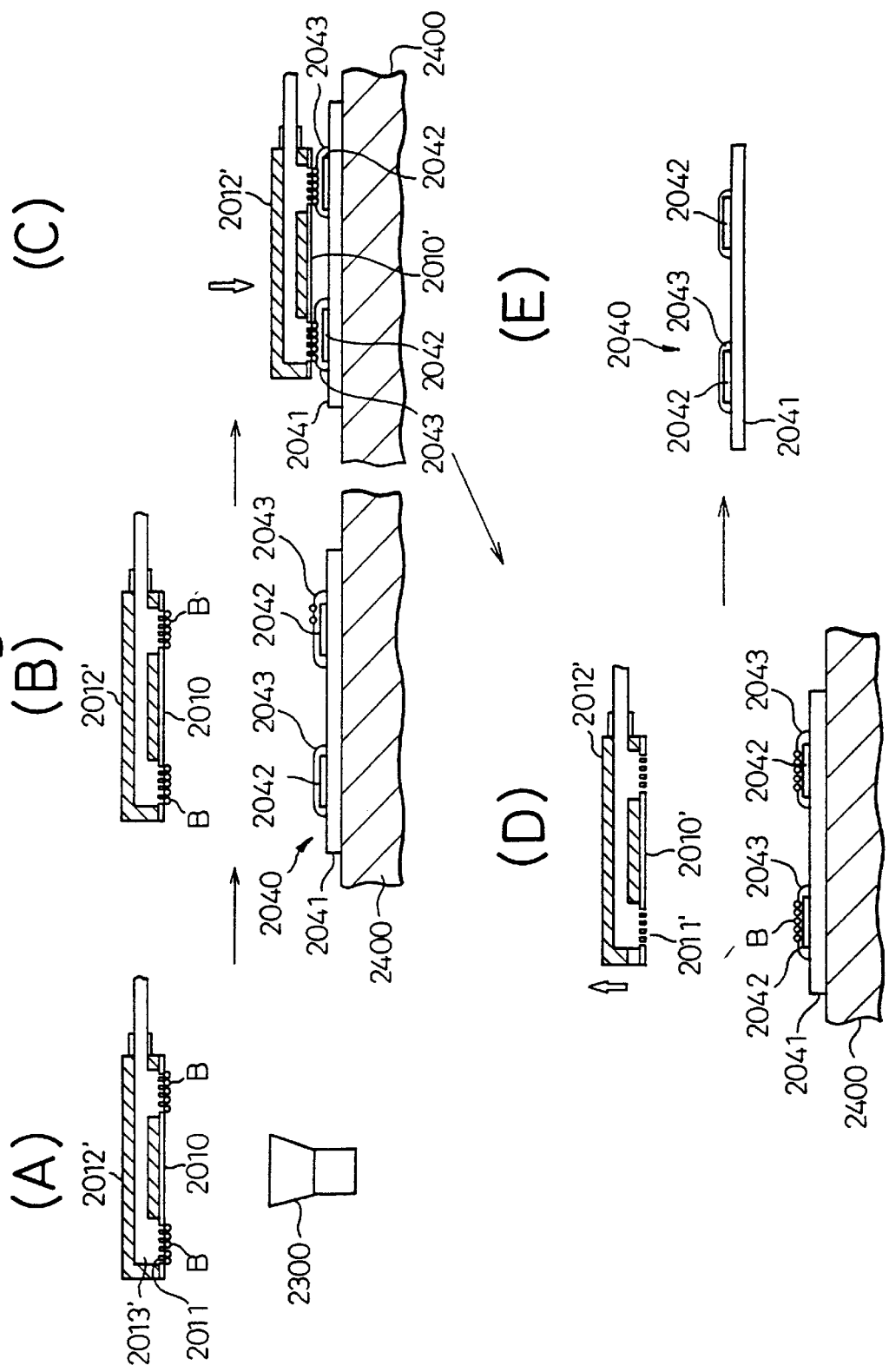

PROCESS AND APPARATUS FOR FORMING BALL BUMPS

This is a divisional of application Ser. No. 08/557,943 filed on Nov. 14, 1995, now U.S. Pat. No. 5,687,901.

BACKGROUND OF THE INVENTION

1. Field of the Invention

The present invention relates to a process and an apparatus for forming ball bumps on the inner leads of a film carrier, the electrode pads of a semiconductor chip, the electrode pads of a printed circuit board, the electrode pads of a flexible circuit board, and the like.

The present invention also relates to a process and an apparatus for removing excess balls from an arrangement plate on which small balls for forming the bumps are held and arranged.

2. Description of the Related Art

The known bumps formed on the electrode pads of an semiconductor chip include wafer bumps and stud bumps.

The wafer bumps are formed on the electrode pads of semiconductor devices fabricated on a semiconductor wafer and not yet cut into chips, by first forming a barrier metal coating on the electrode pads, and then forming a gold or other metal bump on the barrier metal by plating.

The wafer bump has the problems of an increase in the number of the process steps, a reduction in the production yield of the semiconductor devices, and an unacceptable cost particularly when producing many types in small amounts.

The stud bumps are formed on the electrode pads of semiconductor chips by first ball-bonding the pads in the same manner as in the first step of the wire bonding process, and then cutting the bonded wire in its neck to leave a bump on the pad.

The stud bumps have problems in that the cut bumps have pointed tips with uneven heights causing poor reliability and that much process time is required because the bumps are formed pin by pin.

Another known process forms a transferred bump by first growing bumps on a substrate by plating, and then transferring the bumps onto the inner leads of a film carrier. The bumps formed by plating have a semispherical shape providing a bump width greater than a required bump height, and is not suitable for bonding at a small pitch of less than 100 μm.

To solve the above-mentioned problems, a process was proposed to form bumps by transferring small metal balls onto the inner leads.

This process has also a problem in that much time is required in arranging balls one by one on a bonding stage in positions corresponding to positions of the inner leads.

There is also a problem in that, during arranging small metal balls on an arrangement baseplate, excess balls are undesirably adhered to the baseplate or other balls due to electrostatic interaction, etc. Although such excess balls must be thoroughly removed from the baseplate, this is very difficult because the metal balls are very small in size (100 μm or less) and great in number.

U.S. Pat. Nos. 4,332,341 and 5,284,287 disclose a method of attracting small balls to positions corresponding to positions of electrode pads of a semiconductor chip. These patents do not disclose the use of vibration for causing the balls to jump up or removing excess balls. These patents use a small solder ball only.

U.S. Pat. No. 4,462,534 disclose a method of attracting small balls to positions corresponding to positions of electrode pads of a semiconductor chip and a method of causing small balls to jump up for the attraction thereof. This patent does not disclose the use of vibration to remove excess balls. The disclosed small balls are solder balls and are bonded to the head of a connector pin.

SUMMARY OF THE INVENTION

An object of the present invention is to provide a process and an apparatus for forming ball bumps on the inner leads of a film carrier, the electrode pads of a semiconductor chip, the electrode pads of a printed circuit board, the electrode pads of a flexible circuit board, and the like, providing good reliability without requiring excess processing time.

Another object of the present invention is to provide a process and an apparatus for reliably and rapidly removing excess small balls during arranging small balls on an arrangement baseplate.

To achieve the object according to the first aspect of the present invention, there is provided a process of forming ball bumps for electrical connection to an integrated circuit, the process comprising the steps of:

applying a vibration at a small amplitude to a vessel containing small balls of an electroconductive material to cause the small balls to jump up above the vessel;

holding and arranging the small balls on an arrangement baseplate by attracting the jumping small balls to attraction openings provided on one side of the arrangement baseplate in positions corresponding to positions of at least one set of the electrode pads of one semiconductor chip;

removing excess small balls adhered either to the arrangement baseplate or to the small balls attracted to the openings; and simultaneously bonding the small balls held and arranged on the arrangement baseplate to bonding spots arranged in positions corresponding to said positions of said at least one set of the electrode pads.

According to the first aspect of the present invention, there is also provided an apparatus for forming ball bumps for electrical connection to an integrated circuit, comprising:

means for applying a vibration at a small amplitude to a vessel containing small balls of an electroconductive material to cause the small balls to jump up above the vessel;

means for holding and arranging the small balls on an arrangement baseplate by attracting the jumping small balls to attraction openings provided on one side of the arrangement baseplate in positions corresponding to positions of at least one set of the electrode pads of one semiconductor chip;

means for removing excess small balls adhered either to the arrangement baseplate or to the small balls attracted to the openings; and means for simultaneously bonding the small balls held and arranged on the arrangement baseplate to bonding spots arranged in positions corresponding to said positions of said at least one set of the electrode pads.

The first aspect of the present invention is advantageous because the bumps are formed from small balls providing a bump width (diameter) smaller than that of the bumps formed by plating a substrate, enabling bonding at a reduced pitch, and because small balls are caused to jump up for attraction to the baseplate and thereby are reliably and rapidly arranged on a baseplate in positions corresponding to positions of the inner leads of a film carrier, the electrode pads of a semiconductor chip, the electrode pads of a printed circuit board, the electrode pads of a flexible circuit board, or the like. By arranging plural sets of small balls for plural semiconductor chips, the production time and cost are significantly reduced. By using two arranging baseplates, the process including arranging and bonding operations are performed continuously.

According to the second aspect of the present invention, there is provided a process of forming ball bumps for electrical connection to an integrated circuit, comprising the steps of:

providing a first number of sets of small balls of an electroconductive material arranged on a first arrangement baseplate in positions corresponding to positions of the first number of sets of the electrode pads of one semiconductor chip, the first number being at least one;

simultaneously picking up a second number of sets of the small balls on a second arrangement baseplate by attracting the small balls to attraction openings provided in the second arrangement baseplate in positions corresponding to positions of the second number of sets of the electrode pads, the second number being not more than the first number, to hold and arrange the second number of sets of the small balls on the second arrangement baseplate in positions corresponding to their positions on the first arrangement baseplate; and simultaneously bonding the second number of sets of the small balls held and arranged on the second arrangement baseplate to bonding spots arranged in positions corresponding to positions of the second number of sets of the electrode pads.

According to the second aspect of the present invention, there is also provided an apparatus for forming ball bumps for electrical connection to an integrated circuit, comprising:

means for providing a first number of sets of small balls of an electroconductive material arranged on a first arrangement baseplate in positions corresponding to positions of the first number of sets of the electrode pads of one semiconductor chip, the first number being at least one;

means for simultaneously picking up a second number of sets of the small balls on a second arrangement baseplate by attracting the small balls to attraction openings provided in the second arrangement baseplate in positions corresponding to positions of the second number of sets of the electrode pads, the second number being not more than the first number, to hold and arrange the second number of sets of the small balls on the second arrangement baseplate in positions corresponding to their positions on the first arrangement baseplate; and means for simultaneously bonding the second number of sets of the small balls held and arranged on the second arrangement baseplate to bonding spots arranged in positions corresponding to positions of the second number of sets of the electrode pads.

The second aspect of the present invention is advantageous not only because of the same reason as the first aspect, but also because at least one set of small balls for one semiconductor chip are simultaneously picked up from the first arrangement baseplate onto a pickup head, enabling the balls to be reliably and simultaneously bonded to the inner leads of a film carrier, the electrode pads of a semiconductor chip, the electrode pads of a printed circuit board, the electrode pads of a flexible circuit board, etc., thereby significantly reducing the production time and cost.

According to the third aspect of the present invention, there is provided a process of removing excess small balls, comprising:

applying an ultrasonic vibration to an arrangement baseplate on which numerous small balls are held and arranged in selected positions, to remove excess small balls adhered either to the arrangement baseplate or to the small balls held and arranged on the arrangement baseplate.

According to the third aspect of the present invention, there is also provided an apparatus for removing excess small balls, comprising:

an arrangement baseplate having numerous attraction openings to attract small balls, thereby holding and arranging the small balls on the arrangement baseplate; and an ultrasonic vibration source for applying an ultrasonic vibration to the arrangement baseplate to remove excess small balls adhered either to the arrangement baseplate or to the small balls held and arranged on the arrangement baseplate, while retaining the small balls attracted to the attraction openings in the selected positions.

The third aspect of the present invention is advantageous for the following reasons.

An ultrasonic vibrator element is provided as an ultrasonic vibration source which applies an ultrasonic vibration to an arrangement baseplate on which small balls are held and arranged. The ultrasonic vibrator element is operated to apply an ultrasonic vibration to the arrangement baseplate directly or through an arrangement head on which the baseplate is held. This application of the ultrasonic vibration forces excess small balls adhered to the baseplate to instantaneously leave the latter. This ensures that numerous small balls are reliably and properly held and arranged in the selected positions only.

BRIEF DESCRIPTION OF THE DRAWINGS

FIG. 11 is a cross-sectional view schematically illustrating an operation sequence for holding and arranging small balls on an arrangement baseplate according to the second embodiment of the first aspect;

FIG. 12 schematically illustrates, in a series of cross-sectional views, an operation sequence for simultaneously bonding small balls to electrode pads of a semiconductor chip according to the second embodiment of the first aspect;

FIG. 35 schematically illustrates, in a series of cross-sectional views, an operation sequence for holding and arranging small balls on a first arrangement baseplate according to the second embodiment of the second aspect;

FIG. 49 schematically illustrates, in a series of cross-sectional views, an operation sequence for holding and arranging small balls to be bonded on the printed circuit board shown in FIG. 47;

FIG. 50 schematically illustrates, in a series of cross-sectional views, an operation sequence for bonding small solder balls to electrode pads of the printed circuit board shown in FIG. 47.

DESCRIPTION OF THE PREFERRED EMBODIMENTS

Figure 1:
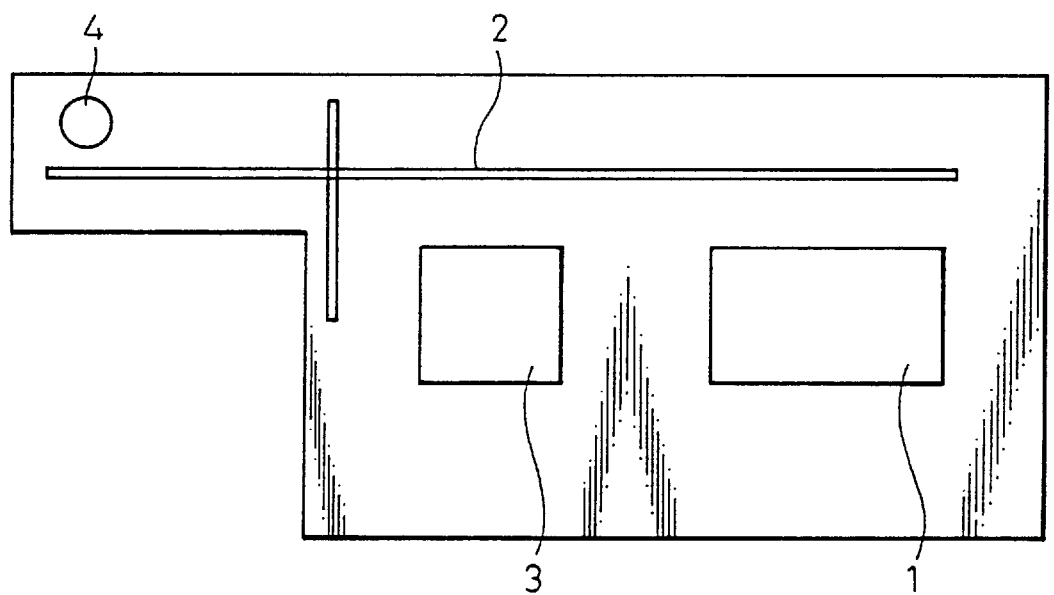
FIG. 1 is a general plan view of an apparatus for forming ball bumps according to the first aspect of the present invention.

According to the first aspect of the present invention, the electroconductive material is typically a metal.

Typically, the small balls have a diameter of 100 $\mu$m or less and are attracted to the attraction openings by vacuum suction.

Preferably, in the holding and arranging step, the arrangement baseplate is held on an arrangement head by its side opposite to a side on which the small balls are held and arranged. More preferably, the arrangement baseplate is held on the arrangement head by being attracted thereto by vacuum suction.

The vacuum suction to attract the arrangement baseplate to the arrangement head and the vacuum suction to attract the small balls to the attraction openings may be performed by a common vacuum suction system, or by separate vacuum suction systems which are separately controllable.

The holding and arranging step preferably further comprises vertically reciprocating the arrangement baseplate at least once to promote selective attraction of the small balls to the attraction openings. Also preferably, the holding and arranging step further comprises vibrating the arrangement baseplate at a small amplitude in a horizontal direction to prevent excess small balls from adhering to the arrangement baseplate.

Typically, the removing step is performed by vibrating the arrangement baseplate, preferably by an ultrasonic vibration.

The process preferably further comprises, after the step of removing and before the step of bonding, verifying that each one of the attraction openings attracts thereto one of the small balls of said at least one set.

According to the second aspect of the present invention, the step of providing the small balls arranged on the first arrangement baseplate typically comprises the substeps of: providing the first arrangement baseplate having attraction openings in positions corresponding to positions of the first number of sets of the electrode pads of the semiconductor chip; holding and arranging the small balls on the first arrangement baseplate, by lowering the first arrangement base plate with its side on which the small balls are held and arranged being directed downward into a vessel containing the small balls to attract the small balls to the attraction openings; and removing excess small balls adhered either to the first arrangement baseplate or to the small balls attracted to the attraction openings.

Alternatively, the step of providing the small balls arranged on the first arrangement baseplate typically comprises the substeps of: providing the first arrangement baseplate having attraction openings in positions corresponding to positions of the first number of sets of the electrode pads of the semiconductor chip; applying a vibration at a small amplitude to a vessel containing the small balls to cause the small balls to jump up above the vessel; holding and arranging the small balls on the first arrangement baseplate, by lowering the first arrangement baseplate with its side on which the small balls are held and arranged being directed downward into the vessel to attract the jumping up small balls to the attraction openings; and removing excess small balls adhered either to the first arrangement baseplate or to the small balls attracted to the attraction openings.

The process preferably further comprises, after the step of providing the small balls on the first arrangement baseplate and before the step of picking up the small balls on the second arrangement base plate, the step of verifying that the small balls are held and arranged on the first arrangement baseplate in positions corresponding to positions of the first number of sets of the electrode pads.

The electroconductive material is typically a metal.

Typically, the small balls have a diameter of 100 $\mu$m or less and are attracted to the attraction openings by vacuum suction.

Preferably, the first and second arrangement baseplates are held on first and second arrangement heads, respectively, by their side opposite a side on which the small balls are held and arranged. More preferably, the first and second arrangement baseplates are held on the first and second arrangement heads, respectively, by being attracted thereto by vacuum suction.

In at least one of the first and second arrangement baseplates, the vacuum suction to attract the arrangement baseplate to the arrangement head and the vacuum suction to attract the small balls to the attraction openings may be performed by a common vacuum suction system or by separate vacuum suction systems which are separately controllable.

The substep of holding and arranging the small balls on the first arrangement baseplate preferably further comprises vertically reciprocating the arrangement baseplate at least once to promote selective attraction of the small balls to the attraction openings. Also preferably, the substep of holding and arranging the small balls on the first arrangement baseplate further comprises vibrating the arrangement baseplate at a small amplitude in a horizontal direction to prevent excess small balls from adhering to the arrangement baseplate.

Typically, the step of removing excess small balls is performed by applying a vibration to the first arrangement baseplate, preferably by an ultrasonic vibration.

According to the present invention, the small balls may be bonded to inner leads of a film carrier, electrode pads of a semiconductor chip, electrode pads of a printed-circuit board, or electrode pads of a flexible circuit board.

According to the third aspect of the present invention, preferably, the small balls are made of a metal or other conductive material and are held and arranged on the arrangement baseplate by being attracted to attraction openings provided on one side of the arrangement baseplate in selected positions.

The ultrasonic vibration source is preferably an ultrasonic vibrator incorporated in the arrangement baseplate for directly applying an ultrasonic vibration to the arrangement baseplate. The ultrasonic vibration source may be an ultrasonic vibrator provided outside the arrangement baseplate for directly applying an ultrasonic vibration to the arrangement baseplate; or an ultrasonic vibrator provided outside the arrangement baseplate for applying an ultrasonic vibration to the arrangement baseplate through a transfer medium; or an ultrasonic vibrator fixed to a free surface of the arrangement baseplate with an adhesive agent for applying an ultrasonic vibration to the arrangement baseplate through a layer of the adhesive agent; or an ultrasonic vibrator disposed away from the arrangement baseplate for applying an ultrasonic vibration to the arrangement baseplate through a solid medium having one end fixed to the ultrasonic vibrator and the other end engaged with the arrangement baseplate.

EXAMPLE 1

A preferred embodiment of the first aspect of the present invention will be described with reference to the attached drawings.

Referring to FIG. 1, an apparatus according to the present invention is generally composed of a ball arranging mechanism 1, a baseplate transfer mechanism 2, a ball recognition means 3, and a bonding stage 4. This apparatus may be fabricated by utilizing, as a base frame, a conventional inner lead bonder or other similar apparatus having a bonding mechanism and by incorporating therein the additional function for arranging and bonding small metal balls.

Figure 2:
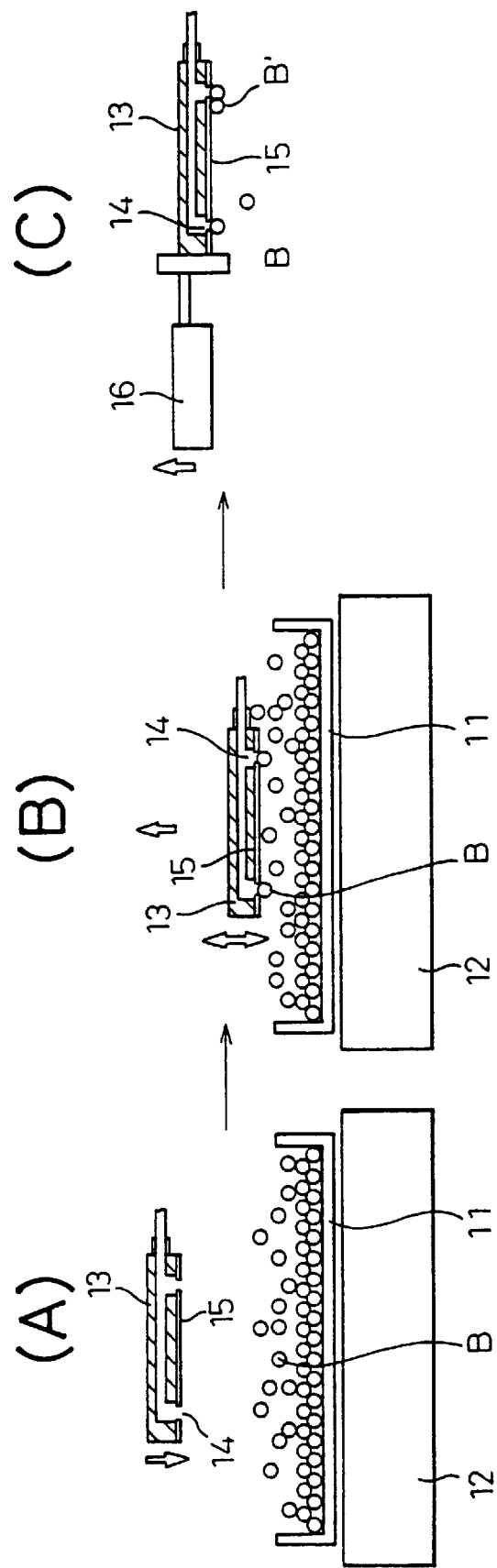
FIG. 2 schematically illustrates, in a series of cross-sectional views, an operation sequence for holding and arranging small balls on an arrangement baseplate according to the first embodiment of the first aspect of the present invention.

FIG. 2 shows an operation sequence in the ball arranging mechanism 1. In the drawings attached hereto, the solid arrows represent the process sequence and the blank or outline arrows represent the direction of motion. In phase (A) of the ball arranging operation, numerous small metal balls B are brought into a ball containing vessel 11 made of a metal and a vibration is then applied to the vessel 11 by a vibration generator 12 such as a parts feeder to cause the small balls B to jump up above the vessel 11. The frequency of the vibration varies in the range up to 1 kHz in accordance with the ball size and the vessel 11 is removable from the vibration generator 12.

The inventors have conducted a detailed experiment and have found that, when the small balls have a diameter of 500 $\mu$m or less, the optimum jumping up conditions include a vibration frequency of 70 to 350 Hz, the jumping up peak height of 1 to 10 mm from the bottom of the ball container vessel, and the distance between the baseplate and the vessel bottom of 0.3 to 3.5 mm during attraction of the small balls to the baseplate. The experiment proved that, if the small balls are caused to jump up under a condition out of the optimum ranges, undesirable attraction often occurs, i.e., the small balls fail to be attracted to all of the attraction openings or two or more balls are attracted to one attraction opening.

In the next phase (B), the jumping small balls B are attracted to an arrangement baseplate 15 held by an arrangement head 13 in the following way. Throughholes or attraction openings 14 smaller in diameter than the balls B are provided at selected positions of the arrangement baseplate 15. The attraction openings 14 are grouped to form sets each corresponding to one set of the electrode pads of one semiconductor chip. The number of the set of the openings 14 is at least one, preferably more than one. The arrangement head 13 is then turned upside down, lowered close to the vessel 11, and vertically reciprocated so that the balls B are attracted to the openings 14 of the arrangement baseplate 15 by vacuum suction. The lowering distance of the head 13 is controllable in terms of 0.1 mm and the reciprocation number is also controllable. The arrangement head 13 is preferably vibrated at a small amplitude in the horizontal direction to minimize the number of excess balls undesirably attracted either to the baseplate 15 or to the balls B attracted to the baseplate 15.

In the phase (C) shown in FIG. 2, the head 13 is raised and the undesirable excess balls B' are removed and recovered from the baseplate 15. The removal of excess balls B is performed by vibrating the head 13 at a small amplitude by a vibration generator 16 so that the excess balls B' alone are removed while the desired small balls B attracted to the openings 14 are retained on the baseplate 15.

Figure 3:
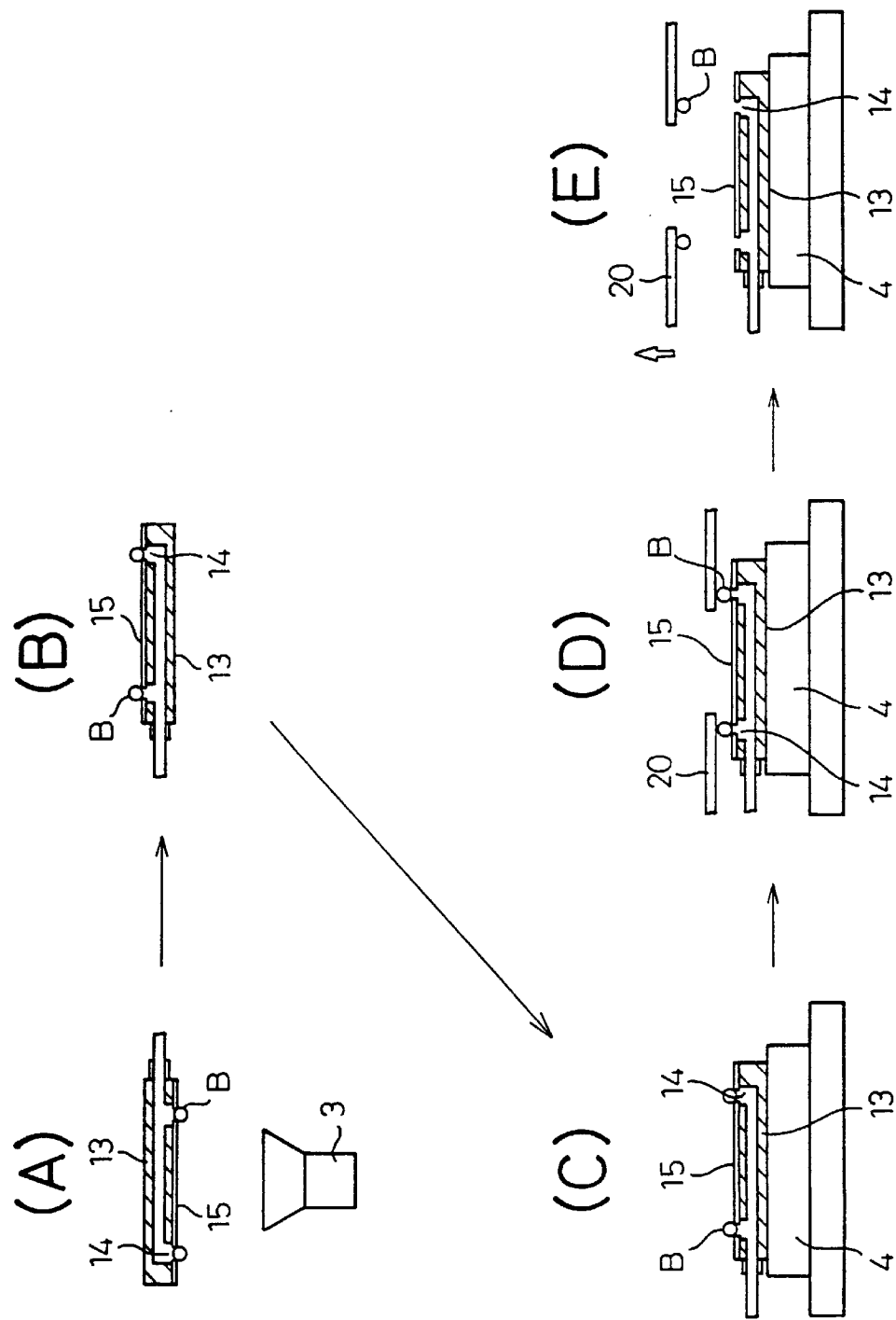
FIG. 3 schematically illustrates, in a series of cross-sectional views, an operation sequence for simultaneously bonding one set of small balls to the inner leads of a film carrier according to the first embodiment of the first aspect.

FIG. 3 schematically illustrates an operation sequence for simultaneously bonding the small balls B to the inner leads of a film carrier. In phase (A), the head 13 is transferred to above the ball recognition means 3, which recognizes a lack or an excess of the attracted balls B by image recognition. When a lack or an excess of balls on the baseplate 15 is recognized, the balls B are thoroughly removed and recovered from the baseplate 15 by terminating vacuum suction and performing mechanical removal and the holding and arranging operation is then repeated in the same manner as described above and shown in FIG. 2.

The arrangement head 13 is then transferred to the bonding stage 4 by the transfer mechanism 2 shown in FIG. 1. Care must be taken not to cause the attracted balls to leave the baseplate 15 due to undesirable fluctuation during the transfer.

In phase (B) of FIG. 3, the transferred head 13 is turn upside down.

In phase (C), the head 13 is placed on the bonding stage 4 of the base frame of the apparatus generally shown in FIG. 1 and is fixed to the stage 4 by vacuum suction.

In phases (D) to (E), the small balls B held and arranged on the arrangement baseplate 15 held by the arrangement head 13, are aligned with the inner leads 20 of a film carrier (not shown). The alignment can be performed by utilizing the alignment mechanism of the base frame. After the alignment, the balls B are simultaneously bonded or transferred to the inner leads 20. The bonding can be performed by utilizing the bonding mechanism of the base frame or inner lead bonder or the like.

Figure 4:
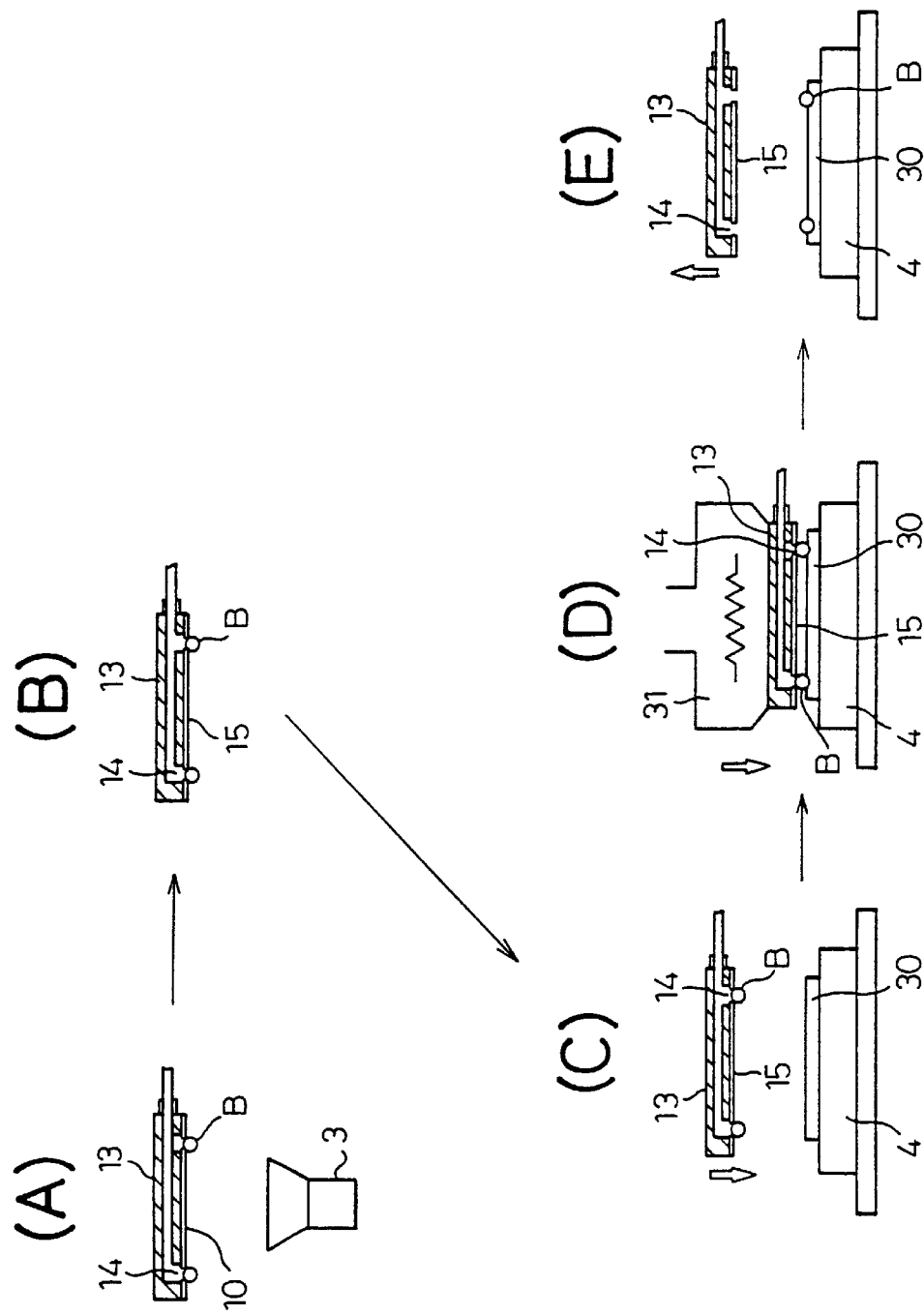
FIG. 4 schematically illustrates, in a series of cross-sectional views, an operation sequence for simultaneously bonding small balls to the electrode pads of a semiconductor chip according to the first embodiment of the first aspect.

FIG. 4 schematically illustrates an operation sequence for simultaneously bonding the small balls B to the electrode pads of an IC chip. A ball recognition phase (A) is performed in the same manner as in phase (A) shown in FIG. 3.

In phase (B), the head 13 is not turned upside down but maintained in the initial direction.

In phase (C), an IC chip 30 is placed on the bonding stage 4. The arrangement head 13 is lowered until the balls B are brought into contact with electrode pads (not shown) of the chip 30.

In phases (D) to (E), the head 13 is pressed downward by a heating tool 31 against the electrode pads to bond the balls B to the electrode pads.

Another preferred embodiment of the first aspect of the present invention will be described below.

Figure 5:
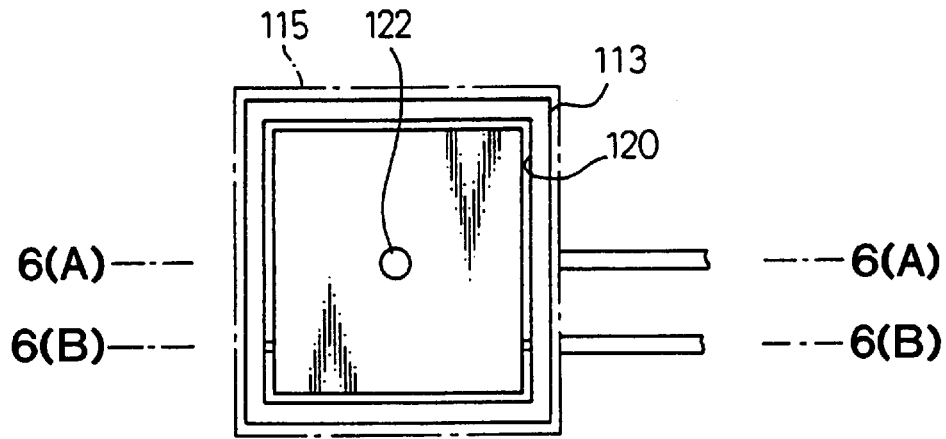
FIG. 5 is a plan view showing an assembly of an arrangement baseplate and an arrangement head, having two separate vacuum suction systems, according to the second embodiment of the first aspect of the present invention.
Figure 6A:
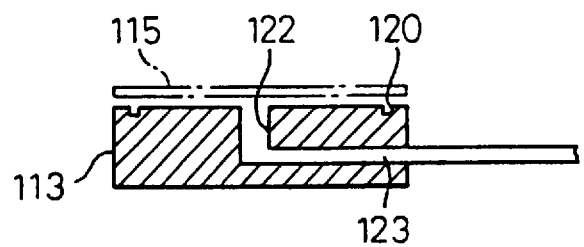
FIGS. 6(A) and 6(B) show cross-sections along the line K—K and the line L—L, respectively, of FIG. 5.
Figure 6B:
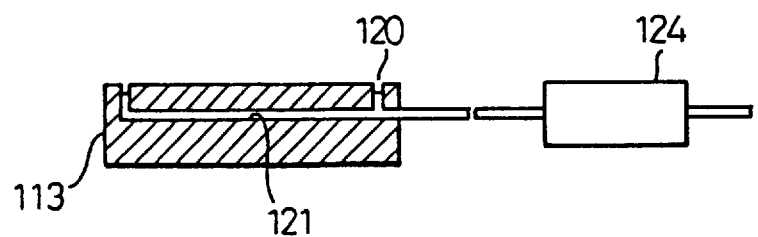

FIGS. 5, 6(A) and 6(B) show an assembly of an arrangement head 113 and an arrangement baseplate 115. The arrangement head 113 has a suction groove 120 along the periphery thereof, as shown in FIG. 5, to effect vacuum suction for holding small balls on the arrangement baseplate 115. The suction groove 120 is communicated with a vacuum pump or other evacuating means through a suction pipe 121 as shown in FIG. 6(B). The arrangement head 113 has a suction hole 122 at the center thereof, as shown in FIG. 5, to effect vacuum suction for holding the arrangement baseplate 115 on the arrangement head 113. The suction hole 122 is communicated with another vacuum pump or other evacuating means through a suction pipe 123 as shown in FIG. 6(A). Thus, two separately controllable vacuum suction systems are provided for holding the balls B and for holding the baseplate 115, respectively.

The arrangement baseplate 115 is prepared for one IC chip. As shown in FIG. 6(A), the suction pipe 121 is provided with a vacuum control regulator 124 to control the attraction force for attracting the balls B to the attraction openings 114 of the arrangement baseplate 115. For example, the arrangement baseplate 115 has 328 attraction openings (82 openings on each edge) having a diameter of 30 μm and a vacuum of 50–60 mmHg is used to attract the balls to the openings 114 (FIG. 7).

Figure 7:
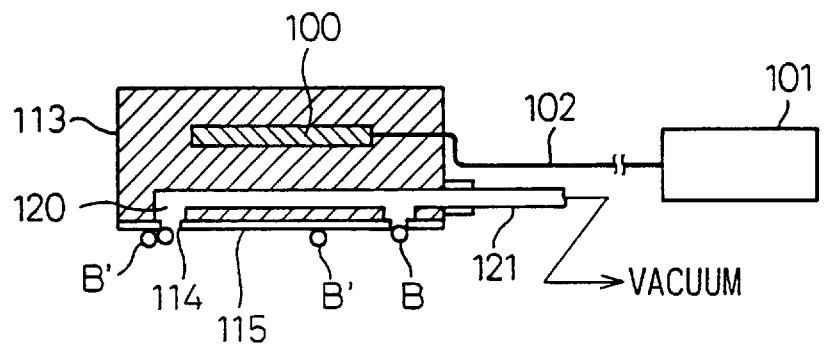
FIG. 7 is a cross-sectional view showing an assembly of an arrangement baseplate and an arrangement head having a vibration source incorporated therein as means for removing excess small balls according to the second embodiment of the first aspect.

In this embodiment, the head 113 incorporates an ultrasonic vibrator element 100 as means for removing excess small balls as shown in FIG. 7. The vibrator element 100 is connected to a control unit 101 through a wiring 102 to control the ultrasonic vibration. The vibrator element 100 is incorporated or embedded in the head 113. The frequency, amplitude, etc. of the ultrasonic vibration generated by the element 100 is suitably controlled by the control unit 101.

The evacuation through the suction pipe 121 causes the balls B to be attracted to the attraction holes 114. The balls B are spherical gold balls having a diameter of 40 μm, for example. Each one of the openings 114 should attract one ball. However, it occasionally occurs that excess balls B' are adhered to the baseplate 115 and/or to the balls B properly attracted to the openings 114, as shown in FIG. 7. The number of excess balls B' is from 5 to 10, for example, although it varies with the total number of the properly attracted balls B.

The ultrasonic vibrator element 100 is operated via the control unit 101 to apply an ultrasonic vibration to the arrangement baseplate 115 through the arrangement head 113. This ultrasonic vibration has an frequency of 30 to 50 kHz, for example. The ultrasonic vibration of the arrangement baseplate 115 forces excess balls B' to instantaneously leave the baseplate 115 and drop into a recovery tray (not shown) located below the baseplate 115. When it is verified that the excess balls B' are thoroughly removed from the baseplate 115, the operation of the ultrasonic vibrator element 100 is stopped.

The ultrasonic vibrator element 100 may be operated during attraction of the balls B to the baseplate 115 to prevent adhesion of excess balls B' while ensuring the necessary and proper attraction of the balls B to the attraction openings 114.

Figure 8:
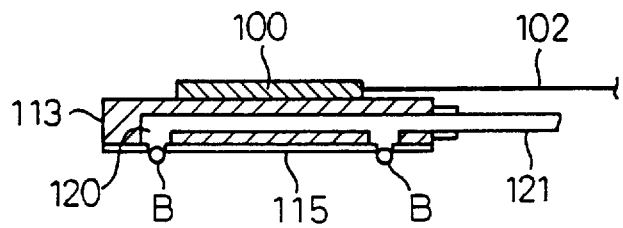
FIG. 8 is a cross-sectional vies showing an assembly of an arrangement baseplate and an arrangement head having a vibration source fixed thereon with a screw etc. as means for removing excess small balls according to the second embodiment of the first aspect.

The ultrasonic vibrator element 100 may be fixed to the back surface of the arrangement head 113 with a screw or other mechanical fastening means, as shown in FIG. 8. The ultrasonic vibrator element 100, even though disposed outside the head 113, applies to the baseplate 115 a sufficient vibration to thoroughly remove excess balls B' therefrom. This embodiment is advantageous because the arrangement head 113 can be compact in size.

Figure 9:
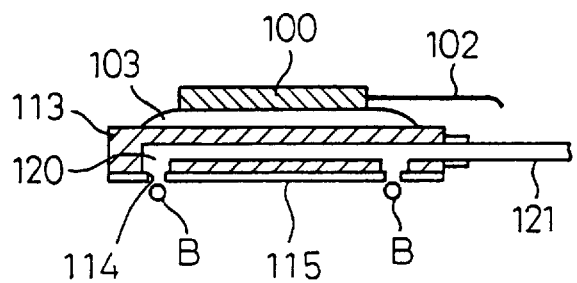
FIG. 9 is a cross-sectional view showing an assembly of an arrangement baseplate and an arrangement head having a vibration source fixed thereon with an adhesive agent as means for removing excess small balls according to the second embodiment of the first aspect.

In another embodiment, as shown in FIG. 9, the ultrasonic vibrator element 100 may be fixed to the back surface of the head 113 with a suitable adhesive agent 103. The use of the adhesive agent 103 provides closer engagement of the element 100 with the head 113. Instead of the adhesive agent 103, rubber or sticky grease may be interposed between the head 113 and the element 100 to fix them to each other.

Figure 10:
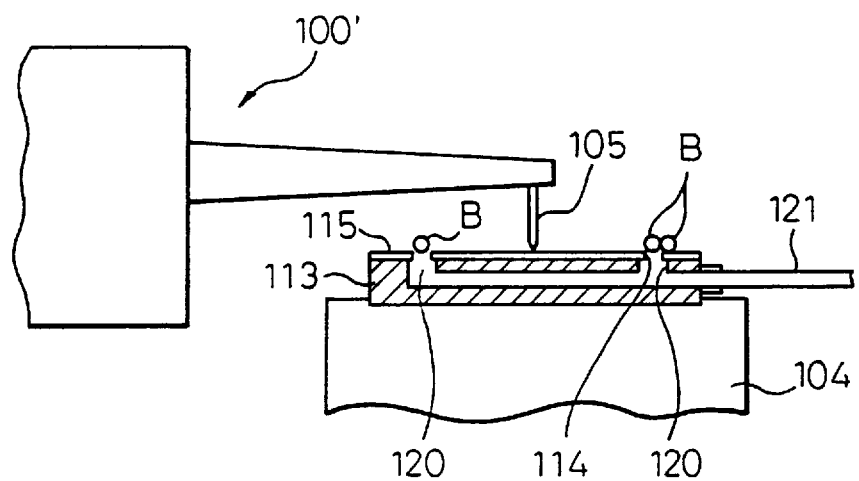
FIG. 10 is a cross-sectional view showing an assembly of an arrangement baseplate and an arrangement head, having a vibration source disposed away therefrom as means for removing excess small balls, according to the second embodiment of the first aspect.

An ultrasonic vibration may be applied to the arrangement baseplate 115 by bringing an ultrasonic vibration source into indirect mechanical contact with the baseplate 115 via a solid medium. Specifically, as shown in FIG. 10, an ultrasonic vibration may be applied to the arrangement baseplate 115 mounted on a stage 104 from an ultrasonic vibrator element 100' disposed away from the baseplate 115 through a solid medium such as a wire bonder capillary 105 engaged with the baseplate 115 at the center and subjected to a constant load (for example, 100 gf).

The ultrasonic vibration applied via the capillary 105 also thoroughly removes excess balls from the baseplate 115. Preferably, air is blown against the upper or front surface of the baseplate 115 at a selected rate to aid removal of the balls from the front surface. No such air blow is necessary when the arrangement baseplate 115 is mounted with its front surface directed downward so that excess balls drop naturally.

The operation of the above embodiment using two separate vacuum suction systems for the ball attraction and the baseplate holding will be described in further details below.

FIG. 11 show an operation sequence for arranging and holding small balls on an arrangement baseplate. In the ball arranging mechanism 1 shown in FIG. 1, a ball arrangement base plate 115 is mounted on an arrangement head 113 having a function to attract small balls. A vibration is applied to a ball container vessel 11. Namely, in phase (A), numerous metal balls B are brought into the vessel 11 and vibration is then applied to the vessel 11 by a vibration generator 12 to cause the balls to jump up above the vessel 11. The frequency of the vibration varies up to 1 kHz in accordance with the ball size, typically 300 to 400 Hz. The vessel 11 is removable from the vibration generator 12.

In phase (B), the baseplate 115 mounted on the head 113 is lowered close to the vessel 11 and vertically reciprocated to attract the balls B to the attraction openings 114 by vacuum suction. The suction force exerted on the balls B through the openings 114 is optimized by the regulator 124 to prevent excess balls B' from adhering to the attraction openings 114.

In phase (C), the arrangement baseplate 115 is raised and the ultrasonic vibrator 100 is then operated via the control unit 101 to apply an ultrasonic vibration to the baseplate 115, with the result that all of the excess balls adhered to the baseplate 115 are instantaneously removed and drop from the baseplate 115. The ultrasonic vibrator element 100 may be operated during attraction of the balls B to the baseplate 115.

In FIG. 12, phase (A), after excess balls have been removed, the arrangement head 113 is moved to a ball recognition means 3, which recognizes a lack or an excess of the attracted balls B by image recognition. When a lack or an excess of balls on the baseplate 15 is recognized, the balls B are thoroughly removed and recovered from the baseplate 15 by terminating vacuum suction and performing mechanical removal and the holding and arranging operation is then repeated.

In phase (B), the arrangement head 113 is transferred to the bonding stage 4 by the baseplate transfer mechanism 2 shown in FIG. 1. Care must be taken not to cause the attracted balls B to leave the baseplate 115 during the transfer.

In phase (C), a semiconductor chip 30 is placed on the bonding stage 4 for performing bonding of the small balls B to the electrode pads of the semiconductor chip 30. The arrangement head 113, which is not turned upside down but maintained in the initial direction, is lowered until the attracted balls B are brought into contact with the electrode pads of the semiconductor chip 30. The head 113 is then pressed downward to bond the balls B to the electrode pads. In phase (D), the head 113 is then raised.

An arrangement baseplate of the present invention may be structured to held and arrange thereon plural sets of small balls for plural semiconductor chips.

Figure 13:
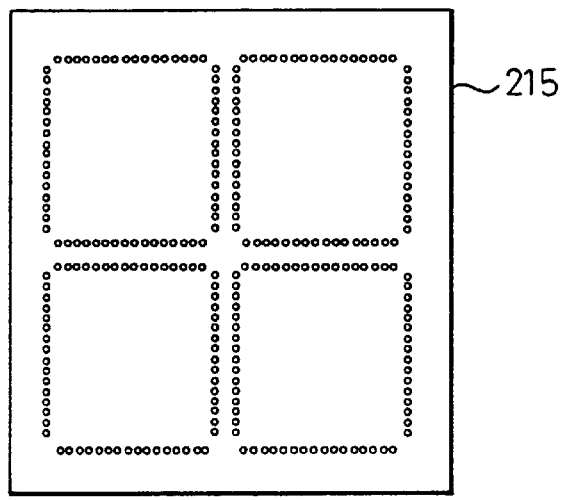
FIG. 13 is a plan view showing an arrangement baseplate having four sets of attraction openings to hold and arrange small balls thereon for four sets of the electrode pads of one semiconductor chip according to the third embodiment of the first aspect of the present invention.
Figure 14:
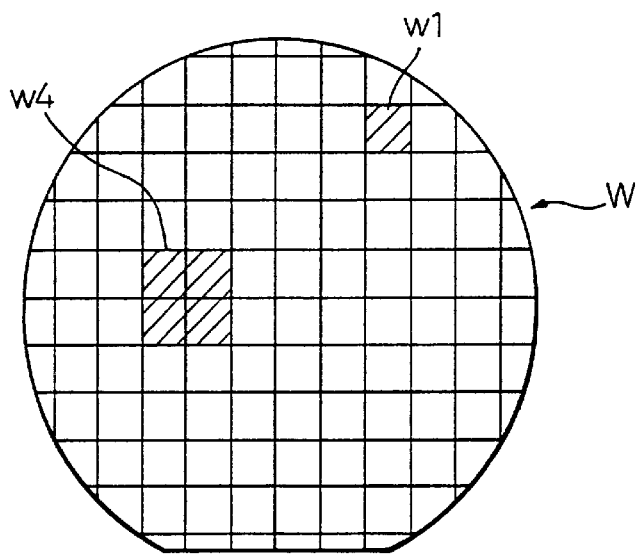
FIG. 14 is a plan view of a semiconductor wafer divided by crossing dicing lines to provide square segments as IC chips according to the third embodiment of the first aspect.
Figure 15:
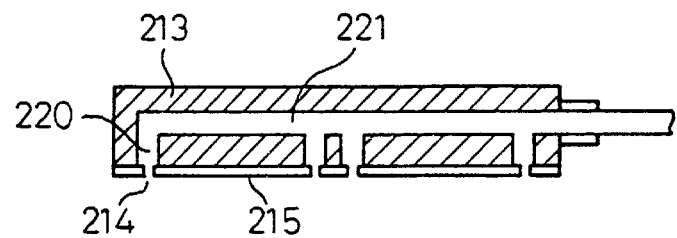
FIG. 15 is a cross-sectional view showing an assembly of an arrangement baseplate and an arrangement head, having plural sets of attraction openings and a vacuum suction system for common use in holding small balls on the arrangement baseplate and in holding the arrangement baseplate on the arrangement head according to the third embodiment of the first aspect.

FIG. 13 shows an arrangement baseplate 215 prepared for four semiconductor chips. FIG. 14 shows a semiconductor wafer W divided by mutually crossing dicing lines to define plural segments each providing one semiconductor chip w1. The baseplate 215 holds and arranges thereon four sets of small balls for four adjoining segments or chips which are generally denoted as w4 in FIG. 14. FIG. 15 is a cross-sectional view showing an assembly of the arrangement baseplate 215 and an arrangement head 213, having four sets of attraction openings 214 for four semiconductor chips.

The head 213 has a suction groove 220 forming a "2×2 lattice" connected to a vacuum pump or other evacuation means through a suction path 221 provided with a vacuum control regulator (not shown) to control the vacuum for attracting the balls to the attraction openings 214. Another evacuation system is also provided to hold the arrangement baseplate 215. Thus, two evacuation systems are provided to attract the small balls and hold the baseplate 215, respectively.

A process using this assembly of the baseplate 215 and the head 213 is performed in the following manner.

Figure 16:
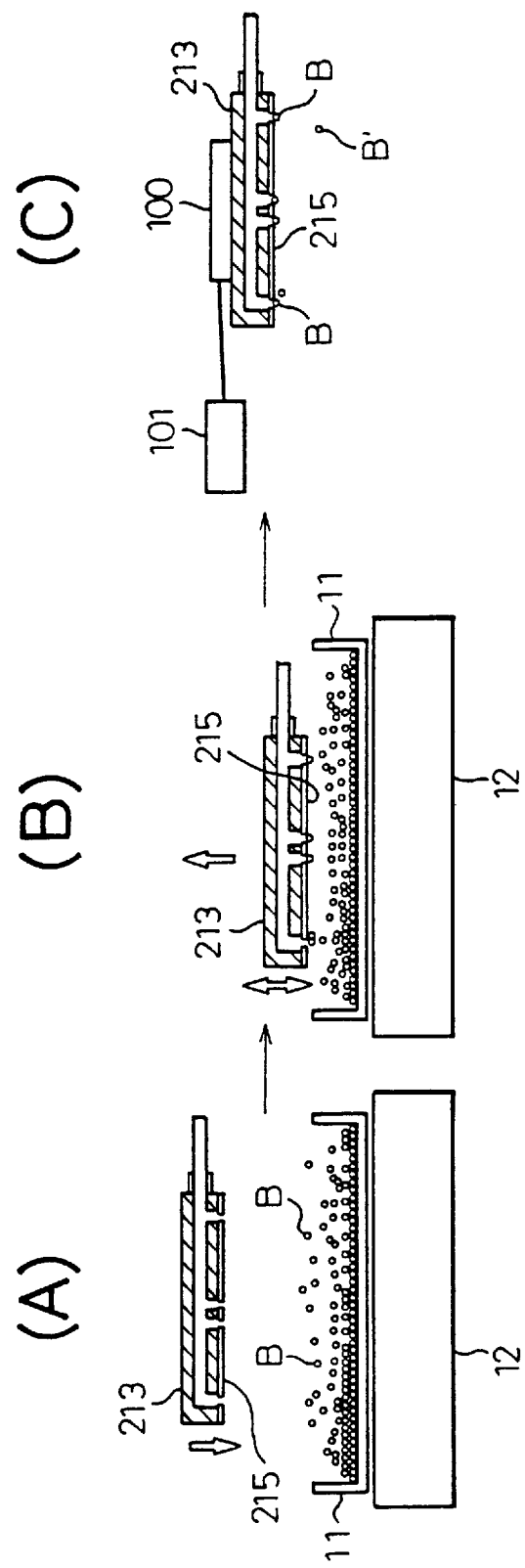
FIG. 16 schematically illustrates, in a series of cross-sectional views, an operation sequence for holding and arranging plural sets of small balls on an arrangement baseplate according to the third embodiment of the first aspect.

FIG. 16 shows an operation sequence in the ball arranging mechanism 1 shown in FIG. 1. In phase (A), the arrangement baseplate 215 is mounted on the arrangement head 213 having a function to attract the balls by vacuum suction. Vibration is applied to the ball container vessel 11. Specifically, numerous metal balls B are brought into the vessel 11 and vibration is then applied to the vessel 11 by a vibration generator 12 to cause the balls to jump up above the vessel 11. The frequency of the vibration varies up to 1 kHz in accordance with the ball size, typically 300 to 400 Hz. The vessel 11 is removable from the vibration generator 12.

In phase (B), the arrangement baseplate 215 is lowered close to the vessel 11 and vertically reciprocated to attract the balls B to the attraction openings 214 (FIG. 15) of the baseplate 215 by vacuum suction. The suction force to attract the balls B to the attraction openings 214 is optimized by a vacuum control regulator to prevent excess balls from adhering to the openings 214.

In phase (C), the arrangement baseplate 215 is then raised and the ultrasonic vibrator element 100 is operated via the control unit 101 to apply an ultrasonic vibration to the baseplate 215. As a result, all of the excess balls B' adhered to the arrangement baseplate 215 are thoroughly removed and drop from the baseplate 215.

Figure 17:
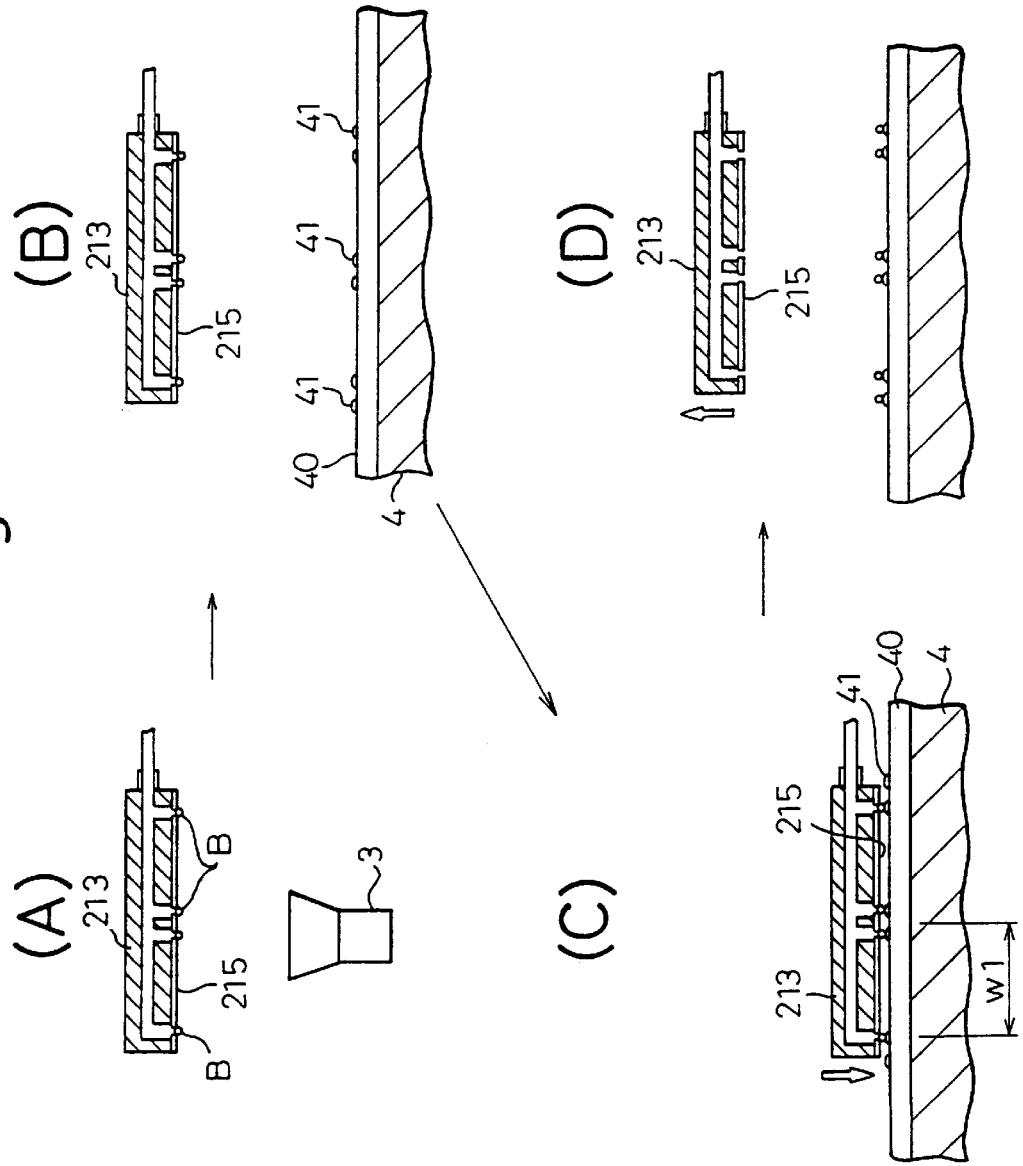
FIG. 17 schematically illustrates, in a series of cross-sectional views, an operation sequence for simultaneously bonding plural sets of small balls to plural sets of electrode pads of plural semiconductor chips or segments on a semiconductor wafer according to the third embodiment of the first aspect.

In FIG. 17, phase (A), after excess balls have been removed, the arrangement head 213 is moved to a ball recognition means 3, which recognizes a lack or an excess of the attracted balls B by image recognition. When a lack or an excess of balls on the baseplate 215 is recognized, the balls B are thoroughly removed and recovered from the baseplate 215 by terminating vacuum suction and performing mechanical removal and the holding and arranging operation is then repeated. Alternatively, when a lack of balls is recognized, the holding and arranging operation may be repeated without performing the thorough removal of balls.

In phase (B), the arrangement head 213 is transferred to the bonding stage 4 by the baseplate transfer mechanism 2 shown in FIG. 1. Care must be taken not to cause the attracted balls B to leave the baseplate 215 during the transfer.

In phase (C), to bond the small balls B to the electrode pads of a semiconductor wafer 40, the semiconductor wafer 40 is placed on the bonding stage 4 and the balls B held and arranged on the baseplate 215 are then aligned with respect to the electrode pads 41 of the wafer 40. The arrangement head 213, which is not turned upside down but maintained in the initial direction, is lowered until the attracted balls B are brought into contact with the electrode pads 41 of the wafer 40. The head 213 is then pressed downward to bond the balls B to the electrode pads 41. In phase (D), the head 213 is then raised.

Another bonding operation sequence using the assembly of the arrangement head 213 and the arrangement baseplate 215 is described below.

After the excess balls B' are thoroughly removed, the arrangement head 213 is moved to a ball recognition means 3, which recognizes a lack or an excess of the attracted balls by image recognition. When a lack or an excess of balls on the baseplate 215 is recognized by the ball recognition means 3, the balls B are thoroughly removed and recovered from the baseplate 215 by terminating vacuum suction and performing mechanical removal and the holding and arranging operation is then repeated. Alternatively, when a lack of balls is recognized, the holding and arranging operation may be repeated without performing the thorough removal of balls.

In phase (B), the arrangement head 213 is transferred to the bonding stage 4 by the baseplate transfer mechanism 2 shown in FIG. 1. Care must be taken not to cause the attracted balls B to leave the baseplate 215 during the transfer. The head 213 is then turned upside down and fixed on the bonding stage 4 of the base frame by vacuum suction. The balls B held and arranged on the baseplate 215 held by the head 213 fixed on the bonding stage 4 are aligned with pads 51 of a semiconductor chip 50 held on the bonding head 400.

In phase (C), the aligned balls B are bonded to the pads 51 by thermocompression bonding. In phase (D), the bonding head 400 is then raised, and in phase (E), the chip 50 having ball bumps B formed thereon is removed from the bonding head 400.

The present invention is not limited to the examples described above but many modification and variation is possible without departing from the scope and spirit thereof. Although the examples describe forming ball bumps on the inner leads 20 of a film carrier or the electrode pads of a semiconductor chip 30 or 50, the present invention is also advantageously applicable to forming ball bumps on the electrode pads of a printed circuit board or a flexible circuit board. Although the examples use metal balls to form ball bumps, the present invention is effectively utilized when electroconductive rubber balls are used.

As herein described above, the first aspect of the present invention uses small balls of a conductive material and advantageously forms bumps having a reduced width or diameter enabling the bump pitch to be reduced with respect to the conventional bumps formed by plating. The balls are arranged in proper positions by attracting balls forced to jump by vibration. The production time and cost are significantly reduced by holding and arranging balls for plural semiconductor chips on a single arrangement baseplate. The process can be continuous by using a pair of arranging baseplates. The film carriers with ball bumps can be mass-produced and the ball bumps are easily formed on the electrode pads of a semiconductor chips at reduced cost. By using two vacuum suction systems, the attraction of balls is properly controlled. The application of an ultrasonic vibration to the arrangement baseplate prevents excess balls from adhering to the baseplate.

EXAMPLE 2

A preferred embodiment of the second aspect of the present will be described with reference to the attached drawings.

Figure 19:
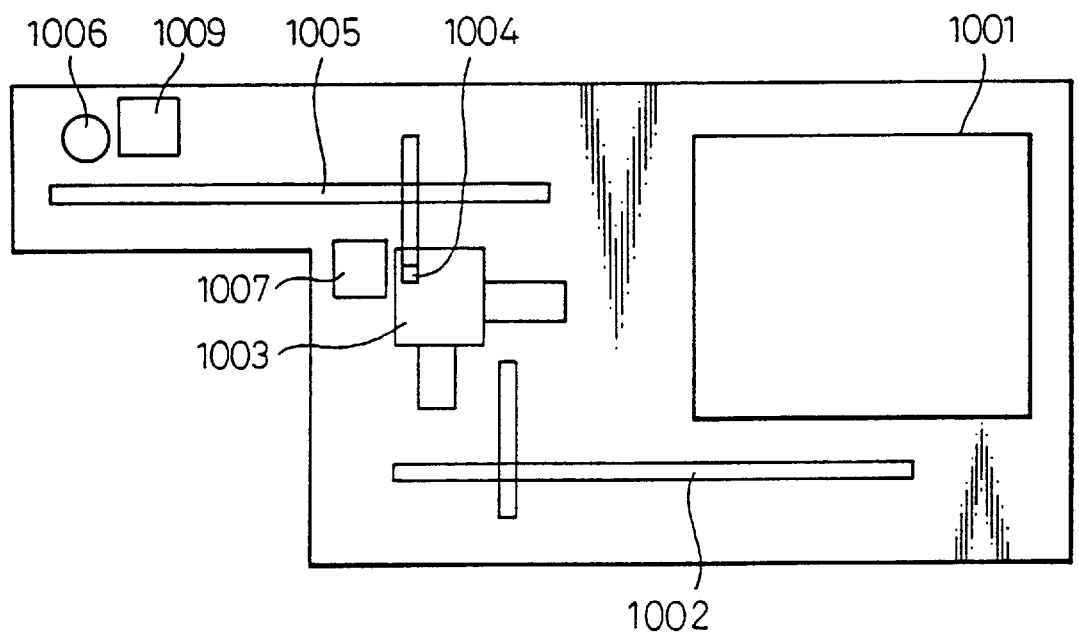
FIG. 19 is a general plan view of an apparatus for forming ball bumps according to the second aspect of the present invention.

Referring to FIG. 19, an apparatus according to the present invention is generally composed of a ball arranging mechanism 1001, a baseplate transfer mechanism 1002, a picking up stage 1003, a pickup head (or second arrangement head) 1004, a head transfer mechanism 1005, and a bonding stage 1006. This apparatus may be fabricated by utilizing, as a base frame, a conventional inner lead bonder or other similar apparatus having a bonding mechanism and by incorporating therein the additional function for arranging and bonding small metal balls.

Figure 20:
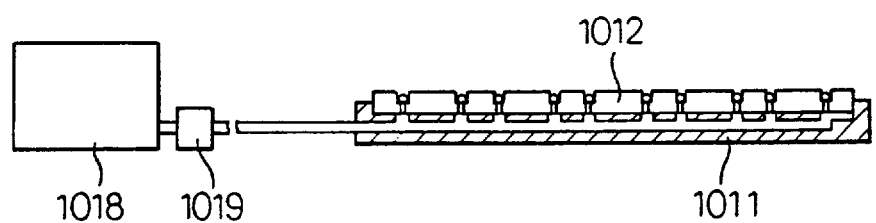
FIG. 20 is a cross-sectional view showing a first assembly of the first arrangement baseplate and the first arrangement head for holding and arranging plural sets of small balls thereon according to the first embodiment of the second aspect of the present invention.
Figure 21A:
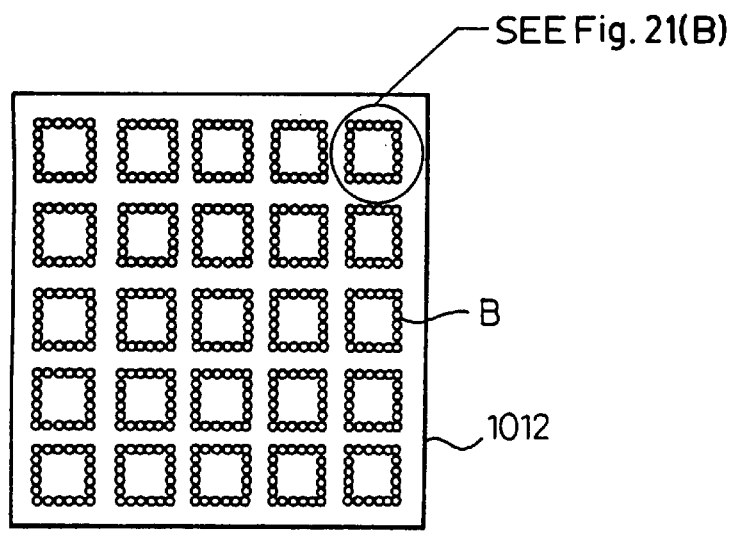
FIG. 21 is a plan view showing the first arrangement baseplate for holding and arranging a first number of sets of small balls thereon according to the first embodiment of the second aspect.
Figure 21B:
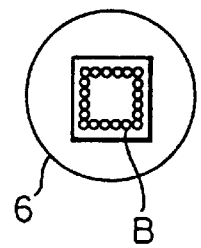
Figure 22:
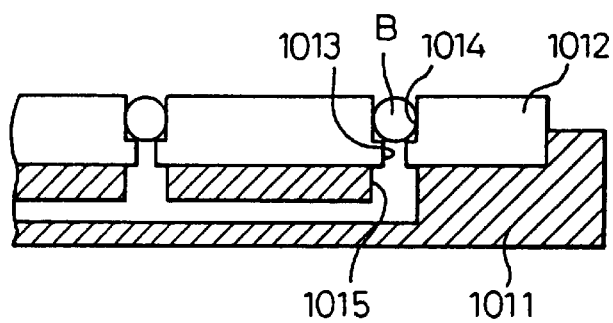
FIG. 22 is an enlarged cross-sectional view of the first assembly of FIG. 20.

In the ball arranging mechanism 1001, an arrangement baseplate 1012, on which balls for plural semiconductor chips can be held and arranged, is mounted on an arrangement head 1011 (FIG. 20) having a function to attract balls (FIG. 21). As shown in FIG. 22, the arrangement baseplate 1012 has throughholes or attraction openings 1013 each attracting and receiving one ball B to arrange the balls B on the baseplate 1012. Each one of the balls B is retained in the recess 1014 forming the front part of the attraction opening 1013 by having an increased diameter with respect to the back part of the opening 1013. The arrangement head 1011 has suction holes 1015 greater in diameter than the back part of the opening 1013 of the arrangement baseplate 1012 so that the arrangement baseplate 1012 is attracted to and held on the arrangement head 1011 by vacuum suction.

Figure 23:
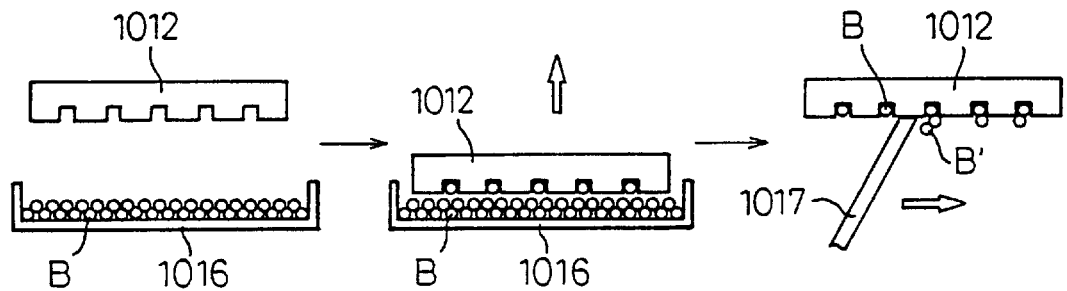
FIG. 23 schematically illustrates, in a series of cross-sectional views, an operation sequence for holding and arranging a first number of sets of small balls on a first arrangement baseplate according to the first embodiment of the second aspect.

As shown in FIG. 23, to reduce the process time, plural sets of balls B for plural semiconductor chips are simultaneously held and arranged on the arrangement baseplate 1012 by lowering and raising the baseplate 1012 with respect to the ball container vessel 1016 (left to middle phases of FIG. 23). For simplicity, the arrangement head 1011 for holding the arrangement baseplate 1012 is not shown in FIG. 23. Excess balls B', i.e., balls other than the balls B properly attracted to the attraction openings by suction are then mechanically removed and recovered from the arrangement baseplate 1012 by using a remover plate 1017 or the like. The properly attracted balls B are retained in the recess 1014 and are not removed.

The head 1011 holding the baseplate 1012 is transferred to the pickup stage 1003 by the transfer mechanism 1002 shown in FIG. 19. Care must be taken not to cause the attracted balls B to leave the baseplate 1012 during the transfer. After the balls B are picked up from the arrangement baseplate 1012, the unloaded arrangement baseplate 1012 is returned to the ball arrangement mechanism 1001. The arrangement head may be provided in two units.

Figure 24:
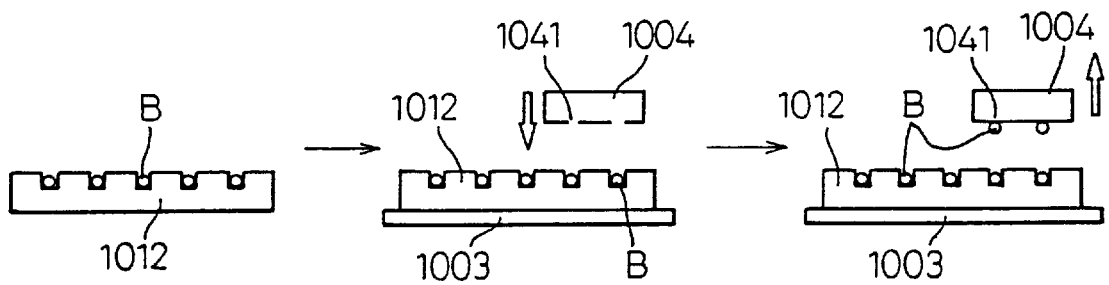
FIG. 24 schematically illustrates, in a series of cross-sectional views, an operation sequence for simultaneously picking up a second number of sets of small balls from the first arrangement baseplate onto the second arrangement baseplate according to the first embodiment of the second aspect.

As shown in FIG. 24, the arrangement baseplate 1012 is then turned upside down and mounted on the pickup stage 1003. The baseplate 1012 should be placed with respect to the pickup stage 1003 within a misregistration which can be corrected in the picking-up operation. The arrangement baseplate 1012 is moved in an x-y plane until it reaches a pickup position at which the balls B held and arranged on the baseplate 1012 are picked up by the pickup head 1004. The ball recognition means 1007 (FIG. 19) then recognizes a lack or an excess of the balls B held and arranged on the baseplate 1012 in a one-chip area, i.e., an area carrying one set of balls for one semiconductor chip. If a lack or an excess of even one ball is recognized, the baseplate 1012 is then moved to subject next one-chip area to the picking-up operation.

Figure 25:
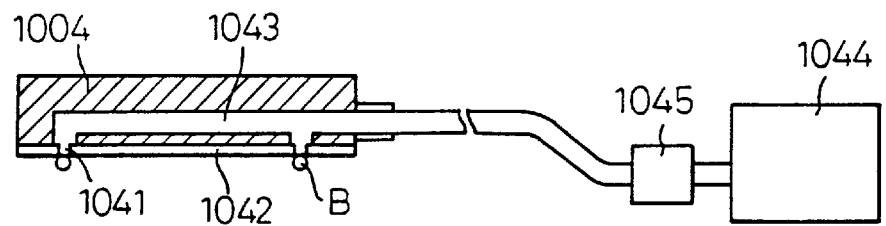
FIG. 25 is a cross-sectional view showing an assembly of the second arrangement baseplate and a second arrangement head for simultaneously picking up small balls from the first arrangement baseplate according to the first embodiment of the second aspect.

The arrangement baseplate 1012 is then x-y-θ-aligned and one set of balls held and arranged on the baseplate 1012 are attracted to the pickup head 1004. As shown in FIG. 25, a second arrangement baseplate 1042 is held on the pickup head or second arrangement head 1004 by vacuum suction through a suction hole 1043. The pickup operation may be performed by switching an adjustment valve 1019 of the vacuum pump 1018 for the first arrangement head and baseplate 1011 and 1012 (FIG. 20) and an adjustment valve 1045 of the vacuum pump 1044 for the pickup or second arrangement head and baseplate 1004 and 1042 (FIG. 25) to switch vacuum suctions on the first arrangement baseplate 1012 and the second arrangement baseplate 1042.

The pickup head 1004, on which the balls B are picked up and arranged, is then transferred to the bonding stage 1006 by the transfer mechanism 1005 (FIG. 19). Care must be taken not to cause the picked up balls to leave the pickup head 1004.

Figure 26:
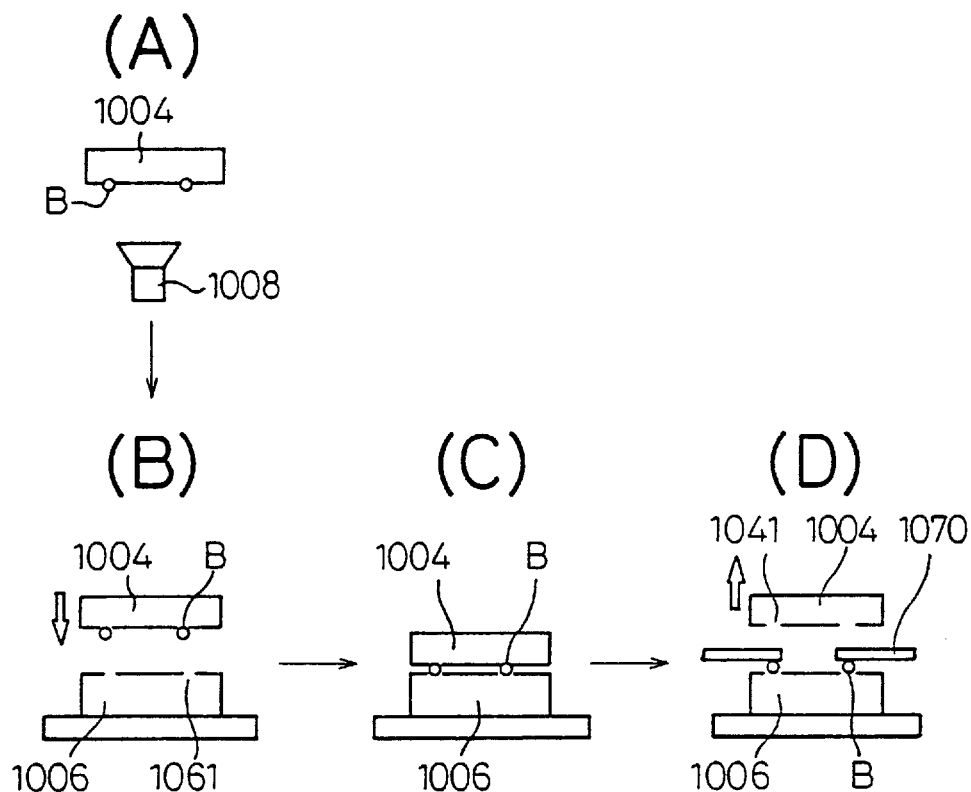
FIG. 26 schematically illustrates, in a series of cross-sectional views, an operation sequence for simultaneously bonding small balls to inner leads of a film carrier according to the first embodiment of the second aspect.
Figure 27:
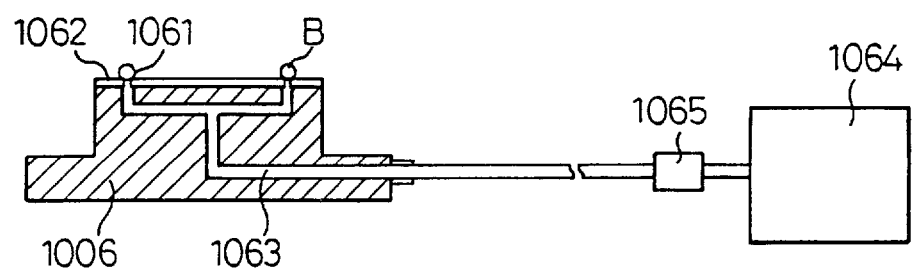
FIG. 27 is a cross-sectional view showing a bonding stage according to the first embodiment of the second aspect.

During the transfer of the pickup head 1004 to the bonding stage 1006, the ball recognition means 1008 recognizes a lack or an excess of the balls B on the pickup head 1004 as shown in FIG. 26, phase (A). As shown in FIG. 27, a baseplate 1062 having attraction openings 1061 arranged thereon is held on the bonding stage 1006 by vacuum suction through a suction hole 1063. The bonding stage 1006 has an area corresponding to that of one semiconductor chip.

In phase (B) of FIG. 26, the balls B arranged on the transferred pickup head 1004 are aligned with the attraction openings 1061 of the bonding stage 1006 by x-y-θ position correction of the stage 1006 with respect to the pickup head 1004. In phase (C), the pickup head 1004 is then lowered to transfer the balls B to the attraction openings 1061 of the baseplate 1062 held on the bonding stage 1006. This is performed by switching the adjustment valve 1045 of the suction pump 1044 for the pickup head 1004 (FIG. 25) and an adjustment valve 1065 of a suction pump 1064 for the bonding stage 1006 (FIG. 27). Thus, the balls B are attracted to and held on the bonding stage 1006.

The ball recognition means 1009 then recognizes all of the balls B held and arranged on the bonding stage 1006 (FIG. 19). This recognition may either be omitted or be performed by utilizing a recognition function of the base frame or inner lead bonder. When a lack or an excess of balls is recognized, the balls B are removed from the bonding stage 1006 and the operation of attracting balls to the bonding stage is repeated.

In phase (D), the balls B held and arranged on the bonding stage 1006 are aligned with inner leads 1070 of a film carrier (not shown) and are then bonded or transferred to the inner leads 1070. This may be performed by utilizing the bonding function of the base frame inner lead bonder.

Figure 28:
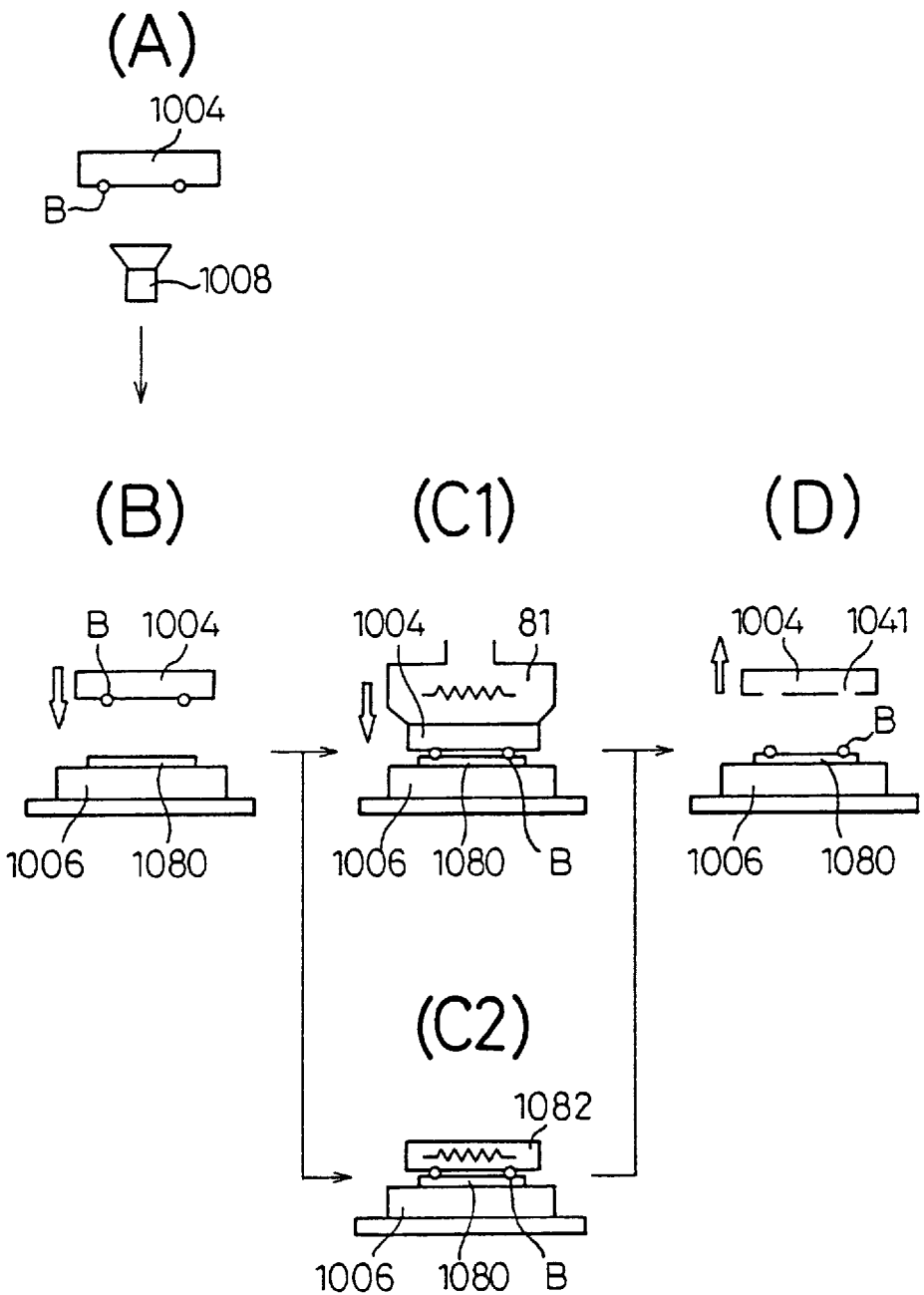
FIG. 28 schematically illustrates, in a series of cross-sectional views, an operation sequence for simultaneously bonding small balls to the electrode pads of one semiconductor chip according to the first embodiment of the second aspect.

FIG. 28 shows an operation sequence for bonding the balls B to the electrode pads of a semiconductor chip.

In phase (A), the balls B on the pickup head 1004 are recognized by the recognition means 1008 in the same manner as in phase (A) of FIG. 26.

In phase (B), a semiconductor chip 1080 is mounted on the bonding stage.

In phase (C1), the pickup head 1004 is lowered until the balls B on the head 1004 are brought into contact with electrode pads of the semiconductor 1080 mounted on the bonding stage and is then pressed downward by a heating tool 1081 to bond the balls B to the electrode pads. A bonding head 1082 provided with a heating and pressing mechanism may be used instead of the bonding head 1004 as shown in phase (C2).

In phase (D), the head 1004 or 1082 is then raised from the bonding stage 1006.

Another embodiment using two vacuum suction systems providing a good suction function will be described below.

Referring to FIG. 22, the arrangement baseplate 1012 having the attraction openings 1013 and the arrangement head 1011 having the vacuum suction function are separately prepared because the attraction openings 1013 must be arranged with a high precision. The attraction for the arrangement baseplate 1012 is effected by utilizing the suction force for the balls B. The suction force, if suitably set for attracting the balls B, is too weak to stably hold the arrangement baseplate 1012 in position and allows the baseplate 1012 to undesirably move out of position during operation. On the other hand, if the suction force is set more intense, the flow rate of atmospheric air flowing through the attraction openings 1013 is accordingly increased and causes an increased number of excess balls to be attracted.

Figure 29:
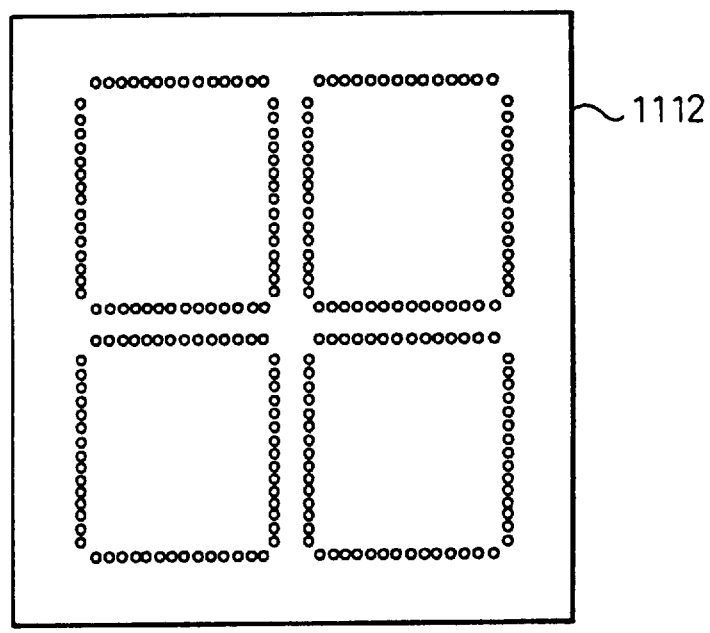
FIG. 29 is a plan view showing a first arrangement baseplate on which plural sets of small balls are arranged according to the second embodiment of the second aspect of the present invention.
Figure 30:
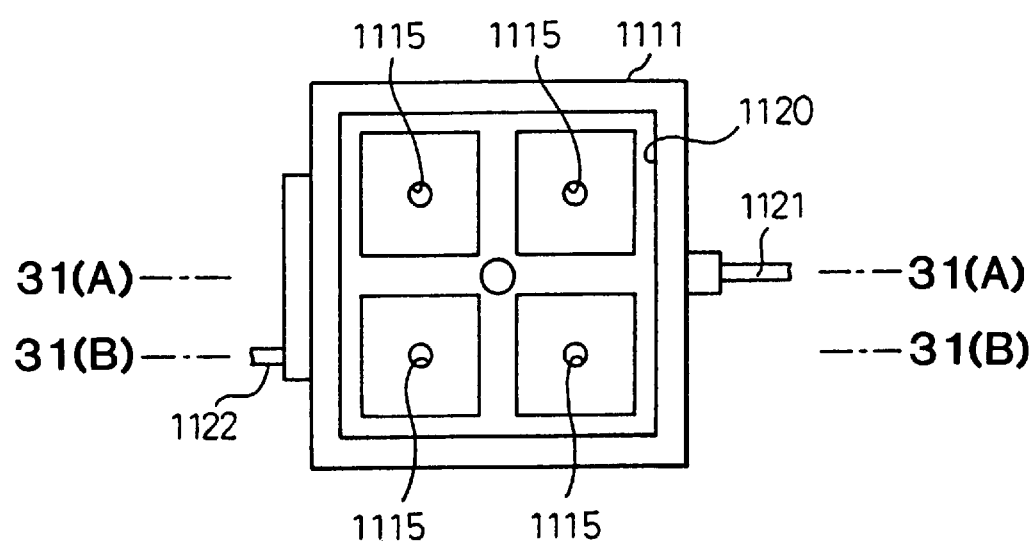
FIG. 30 is a plan view showing an arrangement head for holding the arrangement baseplate of FIG. 29 thereon according to the second embodiment of the second aspect.
Figure 31A:
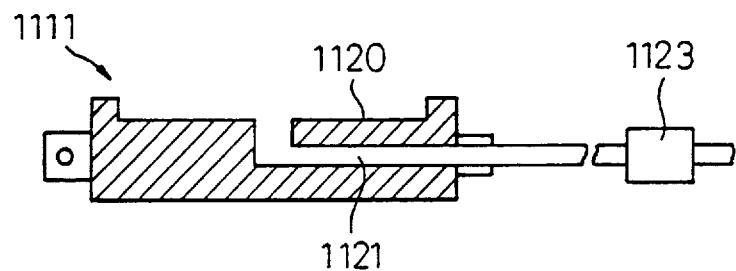
FIGS. 31(A) and 31(B) are cross-sectional views along the line K—K and the line L—L, respectively, of FIG. 30 according to the second embodiment of the second aspect.
Figure 31B:
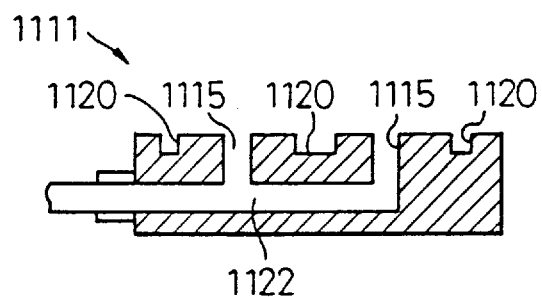

FIGS. 29 and 30 show an arrangement baseplate 1112 and an arrangement head 1111, respectively, of this embodiment. The arrangement baseplate 1112 holds and arranges four sets of balls for four semiconductor chips. The arrangement head 1111 has a suction groove 1120 in the form of a 2×2 lattice available for four semiconductor chips. The groove 1120 is connected to an evacuation means such as a vacuum pump through a suction pipe 1121 as shown in FIG. 31(A). The arrangement head 1111 has four suction holes 1115 connected to an evacuation means such as a vacuum pump through a suction pipe 1122 as shown in FIG. 31(B).

Figure 32:
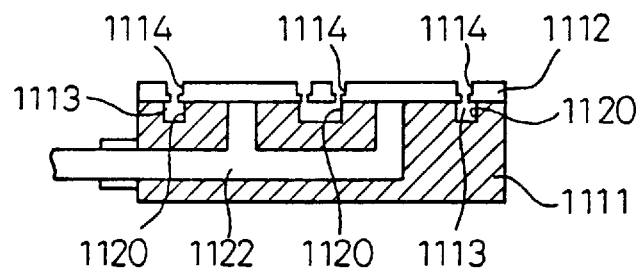
FIG. 32 is a cross-sectional view showing an assembly of a first arrangement baseplate and the first arrangement head for holding and arranging plural sets of small balls for plural semiconductor chips according to the second embodiment of the second aspect.

The arrangement baseplate 1112 is aligned with and placed on the arrangement head 1111 and is held on the latter by vacuum suction through the suction holes 1115 as shown in FIG. 32. The balls B are attracted to the attraction openings 1113 and retained in the recess 1114 of the openings 1113. Thus, the holding of the arrangement baseplate 1112 and the attraction of the balls B are performed by two separate vacuum suction systems.

As shown in FIG. 31(A), the vacuum suction system for attracting the balls B has the suction pipe 1121 provided with a vacuum control regulator 1123 to control the suction force to attract the balls B to the attraction openings 1113 of the arrangement baseplate 1112.

Figure 33:
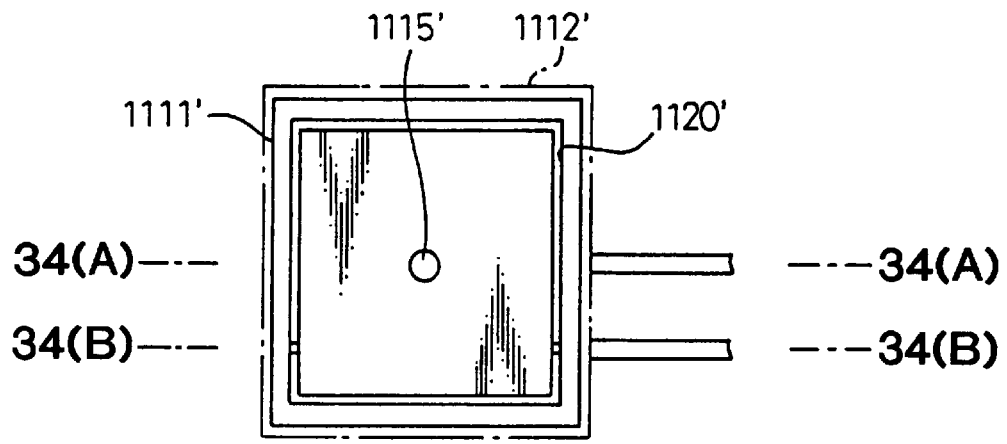
FIG. 33 is a cross-sectional view showing an arrangement head for holding a first arrangement baseplate on which one set of small balls for one semiconductor chip are held and arranged according to the second embodiment of the second aspect.
Figure 34A:
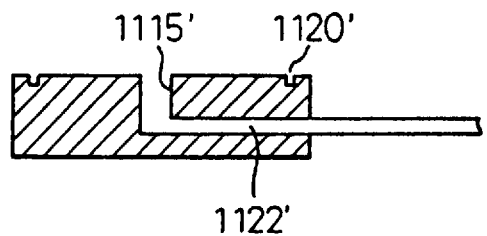
FIGS. 34(A) and 34(B) are cross-sectional views along the line K'—K' and the line L'—L', respectively, of FIG. 33 according to the second embodiment of the second aspect.
Figure 34B:
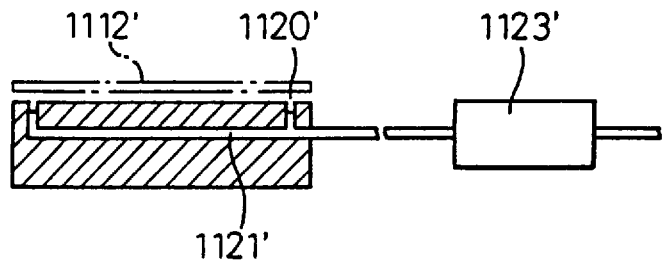

FIGS. 33, 34(A) and 34(B) show an arrangement head 1111' and an arrangement baseplate 1112' for arranging one set of balls for one semiconductor chip. The arrangement head 1111' has a suction groove extending along its periphery (FIG. 33) and connected to an evacuating means such as a vacuum pump through a suction pipe 1121' (FIG. 34(B)). The head 1111' has a suction hole 1115' at its center, which is connected to an evacuating means such as a vacuum pump through a suction pipe 1122' (FIG. 34(A)). Thus, two separate vacuum suction systems are also provided for the arrangement baseplate 1112' available for one set of balls for one semiconductor chip.

As shown in FIG. 34(B), the arrangement head and baseplate 1111' and 1112' for one semiconductor chip also has a suction pipe 1121' provided with a vacuum control regulator 1123'. In this example, the arrangement baseplate 1112' has 328 attraction openings (i.e., 82 openings on each edge) having a diameter of 30 μm and, for example, a vacuum of 50 to 60 mmHg is used for attracting the balls B.

An operation sequence using the arrangement head and baseplate 1111 and 1112 having two separate vacuum suction systems will be described below.

Referring to FIG. 35, phase (A), the arrangement baseplate 1112, on which four sets of balls for four semiconductor chips are held and arranged, is mounted on the arrangement head 1111 having a suction function (FIG. 32). A vibration is applied to a ball container vessel 1016. Specifically, balls B are brought into the vessel 1016 and a vibration is then applied to the vessel 1016 by a vibration generator 1124 such as a parts feeder to cause the small balls B to jump up above the vessel 1016. The frequency of the vibration varies up to 1 kHz in accordance with the ball size and the vessel 1016 is removable from the vibration generator 1124. The arrangement baseplate 1112 is then lowered close to the vessel 1016.

In phase (B), the head 1111, together with the baseplate 1112, is vertically reciprocated as shown by a double-headed blank arrow to attract the balls B to the attraction openings 1113 of the arrangement baseplate 1112. The suction force to attract the balls B to the attraction openings 1113 is optimized by the regulator 1123 (FIG. 31) so that excess balls are prevented from adhering to the attraction openings 1113. The arrangement baseplate 1112 is then raised as shown by a blank arrow.

In phase (C), an ultrasonic vibrator element 1126 is operated via a control unit or ultrasonic vibration generator 125 to apply an ultrasonic vibration to the arrangement baseplate 1112. This forces any excess balls adhered to the arrangement baseplate 1112 to instantaneously leave and drop from the baseplate 1112. The ultrasonic vibrator element 1126 may be operated to apply an ultrasonic vibration to the baseplate 1112 during the operation to attract the balls B to the baseplate 1112.

The arrangement head 1111 holding the baseplate 1112 is then transferred to the pickup stage 1003 by the transfer mechanism 1002 shown in FIG. 19. Care must be taken not to cause the attracted balls to leave the baseplate 1112 due to undesirable fluctuation. Any arrangement baseplate 1112 having been through the pickup operation is returned to the ball arranging mechanism 1001 shown in FIG. 19. Two arrangement heads 1111 may be used to improve the throughput.

Before performing the pickup operation, the ball recognition means 1007 recognizes a lack or an excess of the balls B attracted to the arrangement baseplate 1112 in a one-chip area, i.e., an area carrying one set of balls for one semiconductor chip. If a lack or an excess of even one ball is recognized, the baseplate 1112 is then moved to subject next one-chip area to the picking-up operation.

Figure 36:
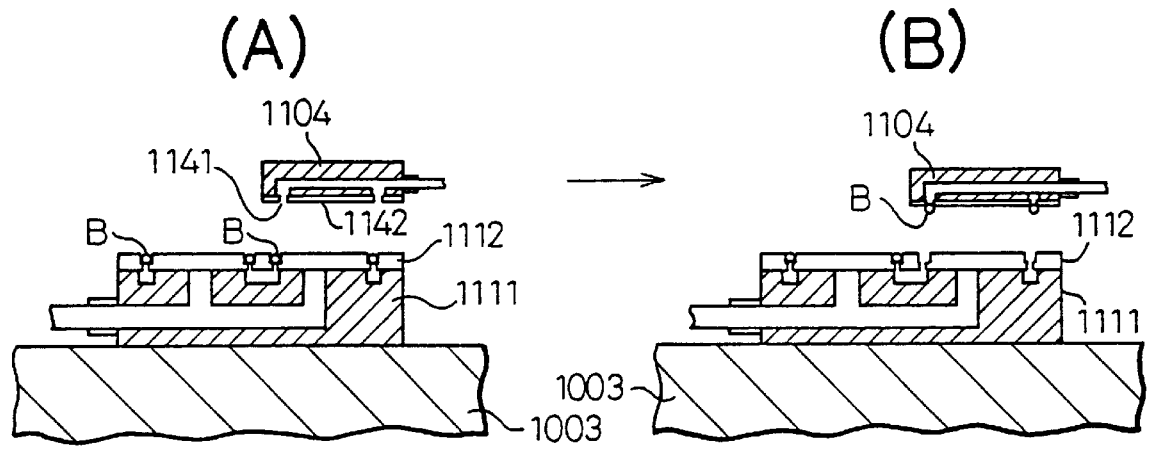
FIG. 36 schematically illustrates, in a series of cross-sectional views, an operation sequence for simultaneously picking up small balls from the first arrangement base plate onto a second arrangement baseplate according to the second embodiment of the second aspect.

FIG. 36 shows an operation sequence for picking up the balls from the arrangement baseplate 1112. In phase (A), the arrangement baseplate 1112 is turned upside down and mounted on the pickup stage 1003. The baseplate 1112 is moved in x-y plane to a pickup position for picking up one set of balls for one semiconductor chip by the pickup head 1104. In phase (B), the arrangement baseplate 1112 is x-y-θ-aligned (e.i., aligned with respect to the x, y, and θ ordinate axes) and one set of the arranged balls for one semiconductor chip are attracted by the pickup head 1004.

Figure 37:
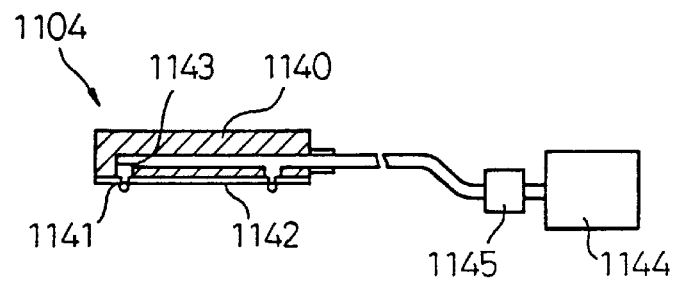
FIG. 37 is a cross-sectional view showing an assembly of a second arrangement baseplate and a second arrangement head for simultaneously picking up small balls from the first arrangement baseplate according to the second embodiment of the second aspect.

As shown in FIG. 37, a second arrangement baseplate 1142 having attraction openings 1141 arranged therein is mounted on the pickup head 1104. The balls B are attracted to the attraction openings 1141 by vacuum suction through suction holes 1143 connected to a vacuum pump 1144 through a regulator 1145. In addition to the vacuum suction system for attracting the balls, there is also provided another vacuum suction system (not shown) for holding the second arrangement baseplate 1142. Namely, the pickup head 1104 has two separate vacuum suction systems for holding the baseplate 1142 and for attracting the balls B, respectively. The pickup head 1104 is interchangeable with the pickup head 1004 mentioned earlier.

The pickup head 1104, to which the balls B are attracted, is transferred to the bonding stage 1006 by the pickup head transfer mechanism shown in FIG. 19. Care must be taken not to cause the attracted balls to leave the baseplate 1142 during the transfer.

Figure 38:
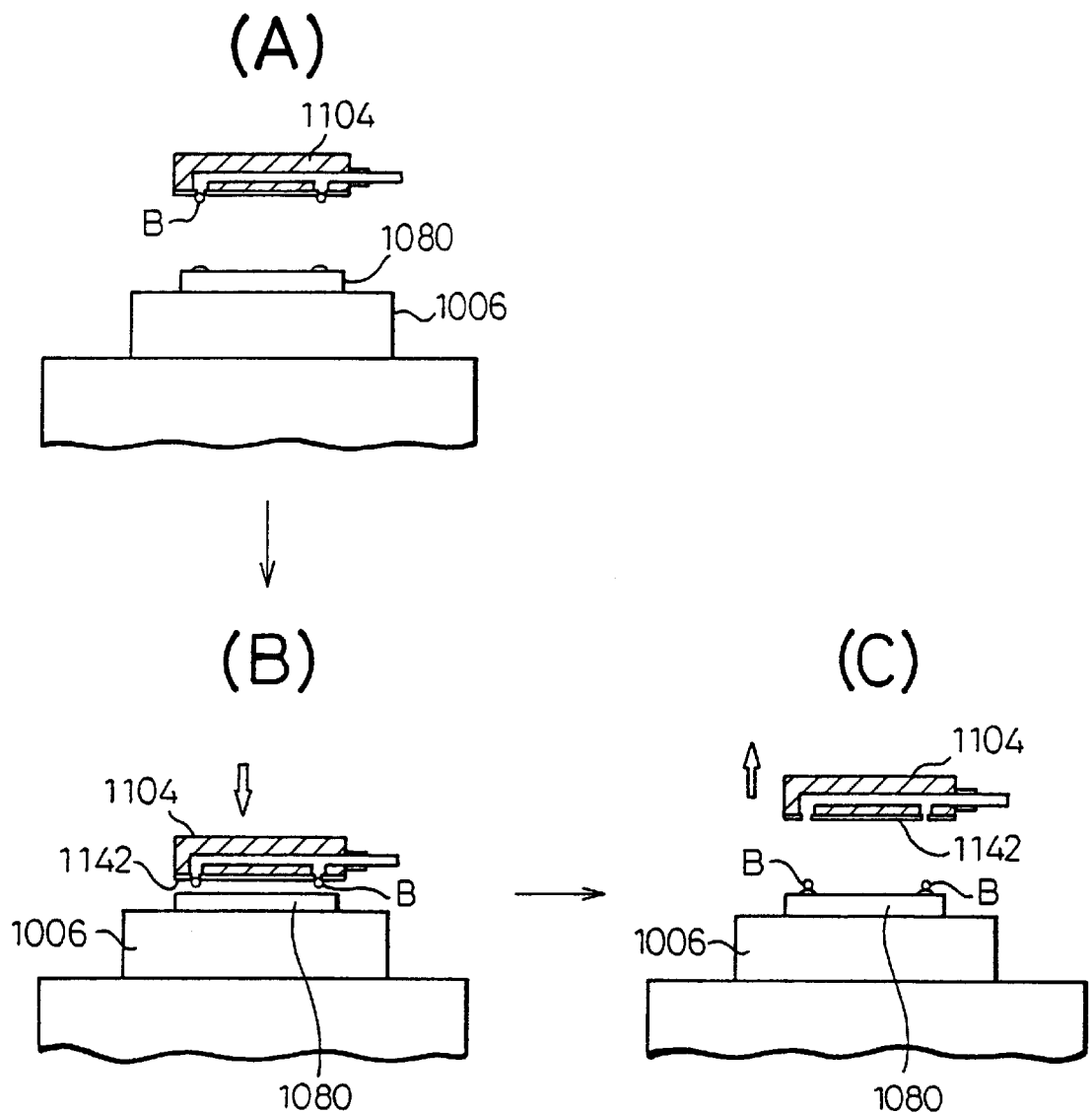
FIG. 38 schematically illustrates, in a series of cross-sectional views, an operation sequence for simultaneously bonding small balls to the electrode pads of one semiconductor chip.

FIG. 38 shows an operation sequence for bonding the balls.

In phase (A), to bond the balls B to electrode pads of a semiconductor chip, a semiconductor chip 1080 is placed on the bonding stage 1006. The pickup head 1104 is then aligned with the bonding stage 1006.

In phase (B), after the alignment, the pickup head 1104 is lowered until the attracted balls B are brought into contact with electrode pads of the semiconductor chip and the head 1104 is then pressed downward to bond the balls B to the electrode pads. The head 1104 may be provided with a heater for bonding. In phase (C), the head 1104 is raised.

In the embodiment described above, to pick up the balls B arranged on the baseplate 1012, the pickup head 1104 may be used instead of the pickup head 1004 shown FIG. 25. The use of the pickup head 1104 having two vacuum suction systems is also advantageous in this case because excess balls B' are prevented from adhering to the second arrangement baseplate 1142 during picking up the balls from the first arrangement baseplate 1012.

The present invention is not limited to the examples described above but many modification and variation is possible without departing from the scope and spirit thereof. Although the examples describe forming ball bumps on the inner leads 1070 of a film carrier or the electrode pads of a semiconductor chip 1080, the present invention is also advantageously applicable to forming ball bumps on the electrode pads of a printed circuit board or a flexible circuit board. Although the examples use metal balls to form ball bumps, the present invention is effectively utilized when electroconductive rubber balls are used.

As herein described above, the second aspect of the present invention uses small balls of a conductive material and advantageously forms bumps having a reduced width or diameter enabling the bump pitch to be reduced with respect to the conventional bumps formed by plating. The balls are arranged in proper positions by attracting balls forced to jump by vibration. The production time and cost are significantly reduced by holding and arranging balls for plural semiconductor chips on a single arrangement baseplate. The process can be continuous by using a pair of arranging baseplates. The film carriers with ball bumps can be mass-produced and the ball bumps are easily formed on the electrode pads of a semiconductor chips at reduced costs. By using two vacuum suction systems, the attraction of balls is properly controlled. The application of an ultrasonic vibration to the arrangement baseplate prevents excess balls from adhering to the baseplate.

EXAMPLE 3

A preferred embodiment of the third aspect of the present invention will be described with reference to the attached drawings.

Figure 39:
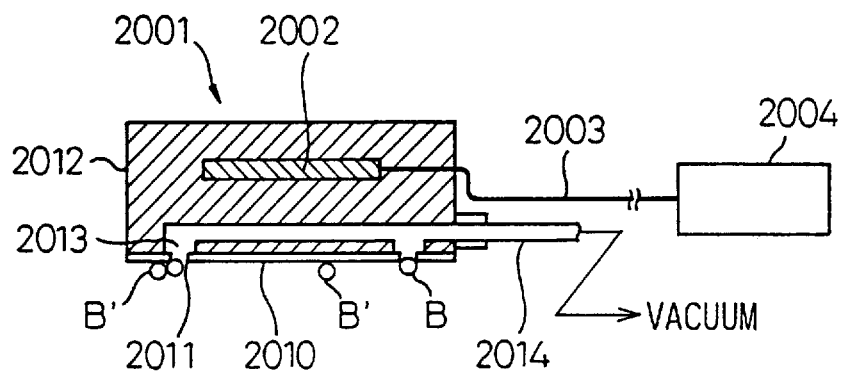
FIG. 39 is a cross-sectional view showing a typical embodiment of the apparatus for removing excess small balls by a vibration source incorporated therein according to the third aspect of the present invention.

FIG. 39 shows an apparatus 2001 for removing excess small balls according to the present invention. The apparatus 2001 has an ultrasonic vibrator element 2002 as an ultrasonic vibration source, which is connected to a control unit 2004 for controlling the ultrasonic vibration through a wiring 2003. Typically, the small balls are small metal balls forming ball bumps for electrical connection.

Referring to FIG. 39, the arrangement baseplate 2010 has attraction openings 2011 for attracting and holding small metal balls B and the head 2012 has a suction hole 2013 connected to an evacuating means such as a vacuum pump (not shown) through a suction pipe 2014. The arrangement baseplate 2010 is precisely positioned with and mounted on the head 2012 so that the attraction openings 2011 are aligned with the suction holes 2013. Specifically, the attraction openings 2011 have a diameter of 30 μm and, for example, 328 openings are provided at a selected pitch and arrangement pattern. The arrangement baseplate 2010 and the head 2012 are separately prepared and are then combined to form an assembly. Alternatively, a baseplate and head assembly may be produced as a monolithic body.

The vibrator element 2002 is incorporated or embedded in the head 2012. The frequency, amplitude, etc. of the ultrasonic vibration generated by the element 2002 is suitably controlled by the control unit 1004.

A process for removing excess small balls using the above-mentioned apparatus will be described below.

The evacuation through the suction pipe 2014 causes the balls B to be attracted to the attraction holes 2011. The balls B are spherical gold balls having a diameter of 40 μm, for example. Each one of the openings 2011 should attract one ball. However, it occasionally occurs that excess balls B' are adhered to the baseplate 2010 and/or to the balls B properly attracted to the openings 2011, as shown in FIG. 39. The number of excess balls B' is from 5 to 10, for example, although it varies with the total number of the properly attracted balls B.

The ultrasonic vibrator element 2002 is operated via the control unit 2001 to apply an ultrasonic vibration to the arrangement baseplate 2010 through the head 2012. This ultrasonic vibration has an frequency of 35 to 40 kHz, for example. The ultrasonic vibration of the arrangement baseplate 2010 forces excess balls B' to instantaneously leave the baseplate 2010 and drop into a recovery tray (not shown) located below the baseplate 2010. When it is verified that the excess balls B' are thoroughly removed from the baseplate 2010, the operation of the ultrasonic vibrator element 2002 is stopped.

The ultrasonic vibrator element 2002 may be operated during attraction of the balls B to the baseplate 2010 to prevent adhesion of excess balls B' while ensuring the necessary and proper attraction of the balls B to the attraction openings 2011.

Figure 40:
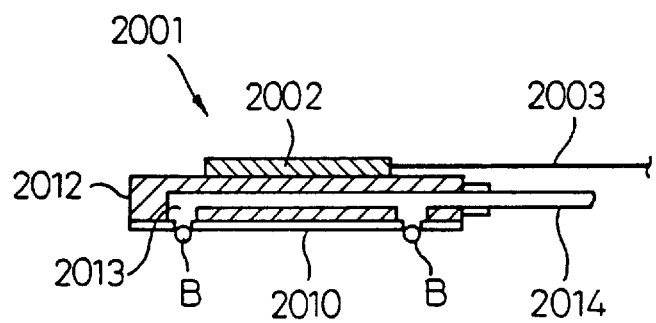
FIG. 40 is a cross-sectional view showing a modified embodiment of the apparatus for removing excess small balls by a vibration source fixed thereon with a screw, etc. according to the third aspect.

The ultrasonic vibrator element 2002 may be fixed to the back surface of the head 2012 with a screw or other mechanical fastening means, as shown in FIG. 40. The ultrasonic vibrator element 2002, even though disposed outside the head 2012 or a monolithic head and baseplate assembly, applies to the baseplate 2010 a sufficient vibration to thoroughly remove excess balls B' therefrom. This embodiment is advantageous because the arrangement head 2010 can be compact in size.

Figure 41:
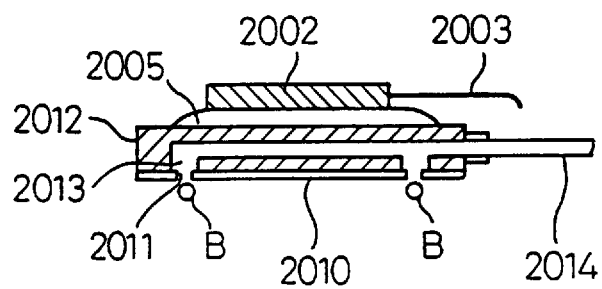
FIG. 41 is a cross-sectional view showing another modified embodiment of the apparatus for removing excess small balls by a vibration source fixed thereon with an adhesive agent according to the third aspect.

In another embodiment as shown in FIG. 41, the ultrasonic vibrator element 2002 may be fixed to the back surface of the head 2012 with a suitable adhesive agent 2005. The use of the adhesive agent 103 provides closer engagement of the element 2002 with the head 2012. Instead of the adhesive agent 2005, rubber or sticky grease may be interposed between the head 2012 and the element 2002 to fix them to each other.

In the above-described embodiments, the ultrasonic vibrator element 2002 is either incorporated in the assembly of the baseplate 2010 and the head 2012 (or a monolithic assembly) (FIG. 39) or disposed outside the latter (FIGS. 40 and 41). Alternatively, an ultrasonic vibration source may be disposed away from the baseplate 2010 and the head 2012 to apply an ultrasonic vibration to the baseplate 2010 via a suitable medium (for example, water), i.e., an ultrasonic vibration generated in the ultrasonic vibration source propagates through the medium to reach the baseplate 2010.

Figure 42:
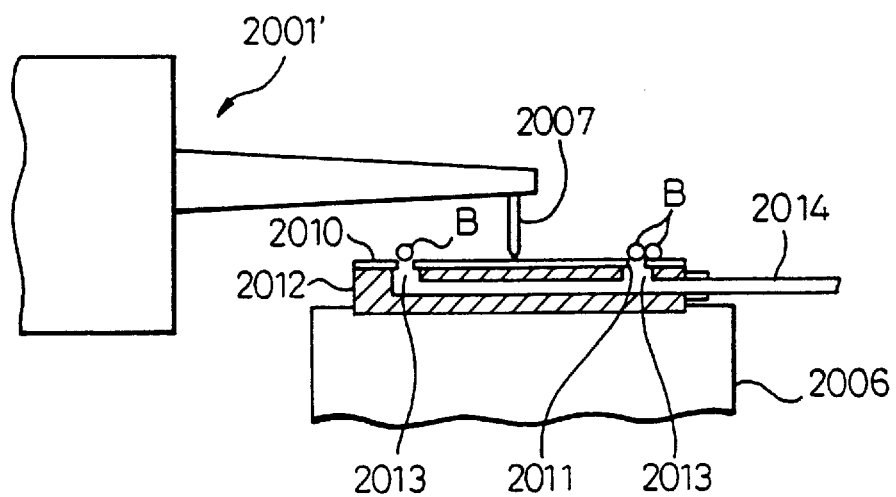
FIG. 42 is a cross-sectional view showing a further modified embodiment of the apparatus for removing excess small balls by a vibration source disposed away therefrom according to the third aspect.

An ultrasonic vibration may be applied to the arrangement baseplate 2010 by bringing an ultrasonic vibration source into indirect mechanical contact with the baseplate 2010 via a solid medium. Specifically, as shown in FIG. 42, an ultrasonic vibration may be applied to the arrangement baseplate 2010 mounted on a stage 2006 from an ultrasonic vibrator element 2001' disposed away from the baseplate 2010 through a solid medium such as a wire bonder capillary 2007 engaged with the baseplate 2010 at the center and subjected to a constant load (for example, 100 gf).

The ultrasonic vibration applied via the capillary 2007 also thoroughly removes excess balls from the baseplate 2010. Preferably, air is blown against the upper or front surface of the baseplate 2010 at a selected rate to aid removal of the balls from the front surface. No such air blow is necessary when the arrangement baseplate 2010 is mounted with its front surface directed downward so that excess balls drop naturally.

The excess small ball removing process and apparatus according to the third aspect of the present invention is advantageously utilized in the process of forming small ball bumps on inner leads of an film carrier or electrode pads of a semiconductor chip in the following manner.

Figure 43:
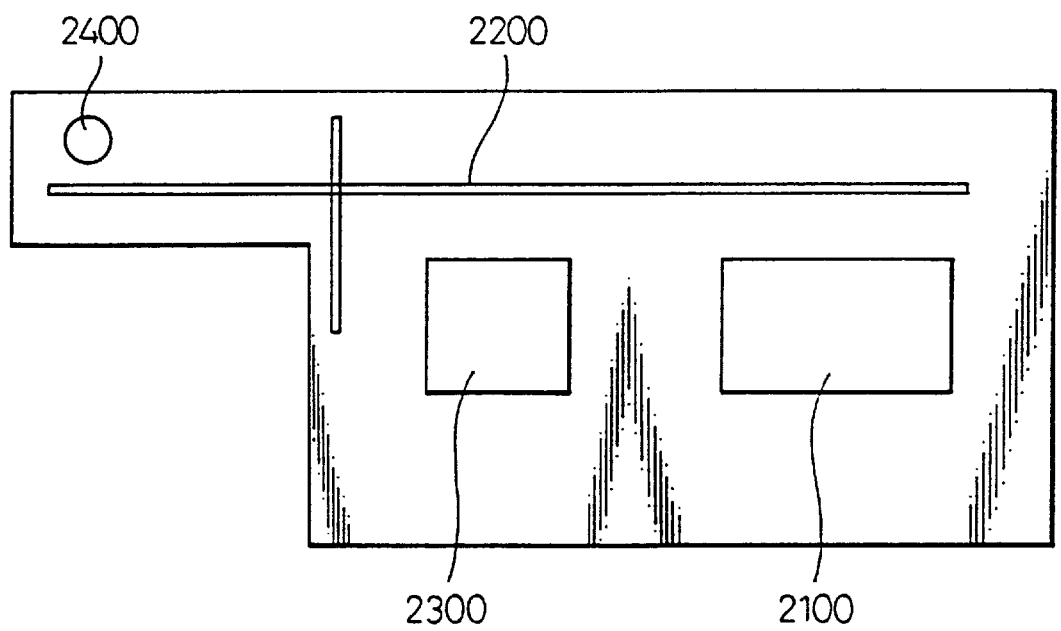
FIG. 43 is a general plan view of an apparatus for forming ball bumps, which incorporates the apparatus for removing excess small balls of the third aspect.

Referring to FIG. 43, an apparatus for forming small ball bumps is generally composed of a ball arranging mechanism 2100, a baseplate transfer mechanism 2200, a ball recognition means 2300, and a bonding stage 2400. This apparatus may be fabricated by utilizing, as a base frame, a conventional inner lead bonder or other similar apparatus having a bonding mechanism and by incorporating therein the additional function for arranging and bonding small metal balls.

Figure 44:
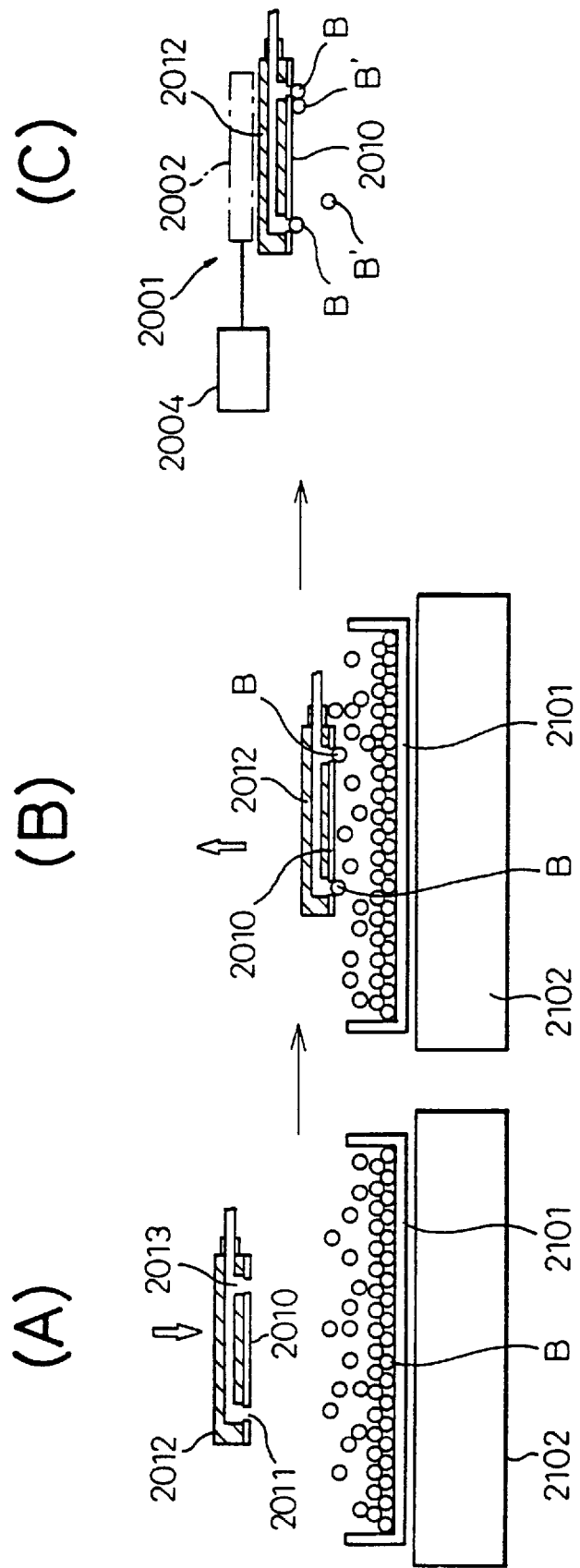
FIG. 44 schematically illustrates, in a series of cross-sectional views, an operation sequence for holding and arranging small balls on an arrangement baseplate of an arrangement mechanism of the apparatus shown in FIG. 43, according to the third aspect.

FIG. 44 shows an operation sequence in the ball arranging mechanism 2100 (FIG. 43). In phase (A) of the ball arranging operation, numerous small metal balls B are brought into a ball containing vessel 2101 made of a metal and a vibration is then applied to the vessel 2010 by a vibration generator 2102 such as a parts feeder to cause the small balls B to jump up above the vessel 2101. The frequency of the vibration varies in the range upto 1 kHz in accordance with the ball size and the vessel 2101 is removable from the vibration generator 2102.

In the next phase (B), the jumping small balls B are attracted to an arrangement baseplate 2010 held by an arrangement head 2012 in the following way. Throughholes or attraction openings 2011 smaller in diameter than the balls B are provided in selective positions of the arrangement baseplate 2010. The attraction openings 2011 are grouped to form sets each corresponding to one set of the electrode pads of one semiconductor chip. The number of the set of the openings 2011 is at least one, preferably more than one. The arrangement head 2012 is then lowered close to the vessel 11, and vertically reciprocated so that the balls B are attracted to the openings 2011 of the arrangement baseplate 2010 by vacuum suction. The lowering distance of the head 2012 is controllable in terms of 0.1 mm and the reciprocation number is also controllable. The arrangement head 2012 is preferably vibrated at a small amplitude in the horizontal direction to minimize the number of excess balls undesirably attracted either to the baseplate 2010 or to the balls B properly attracted to the baseplate 2010.

In phase (C), the head 2012 is raised and the ultrasonic vibration element 2002 is then operated through the control unit 2004 to apply an ultrasonic vibration to the baseplate 2010. This causes excess balls B to instantaneously leave and drop from the baseplate 2010. The ultrasonic vibrator element 2002 may be operated so that an ultrasonic vibration is applied to the baseplate 2010 during the attraction of the balls B.

Figure 45:
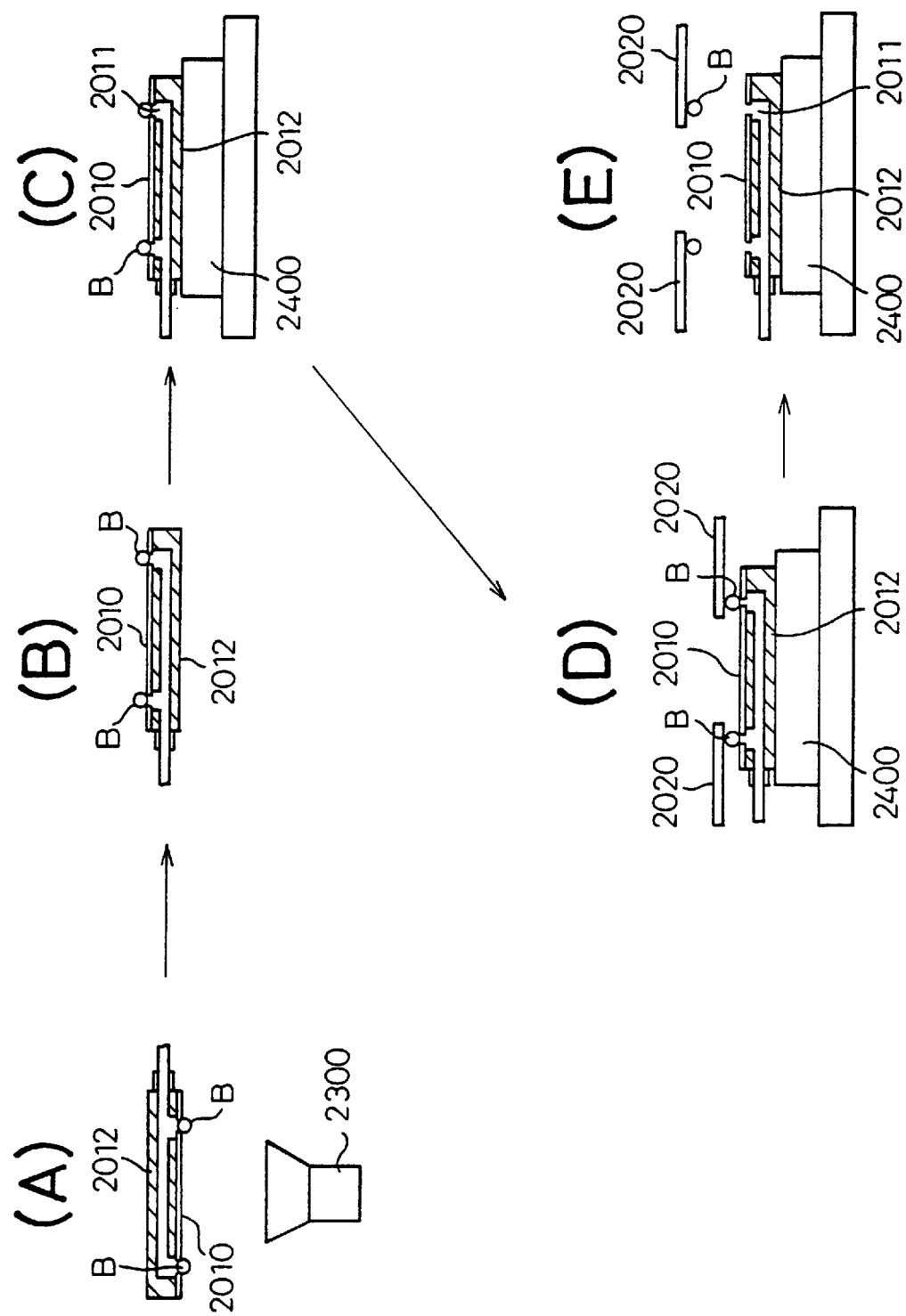
FIG. 45 schematically illustrates, in a series of cross-sectional views, an operation sequence for bonding small balls to inner leads of a film carrier in the apparatus shown in FIG. 43, according to the third aspect.

FIG. 45 schematically illustrates an operation sequence for simultaneously bonding the small balls B to the inner leads of a film carrier. In phase (A) of FIG. 45, the head 2012 is transferred to above the ball recognition means 2300, which recognizes a lack or an excess of the attracted balls B by image recognition. When a lack or an excess of balls on the baseplate 2010 is recognized, the balls B are thoroughly removed and recovered from the baseplate 2010 by terminating vacuum suction and performing mechanical removal and the holding and arranging operation is then repeated.

The arrangement head 2012 is then transferred to the bonding stage 2400 by the transfer mechanism 2200 shown in FIG. 43. Care must be taken not to cause the attracted balls to get off the baseplate 2010 due to undesired fluctuation during the transfer.

In phase (B) of FIG. 45, the transferred head 2012 is turn upside down.

In phase (C), the head 2012 is placed on the bonding stage 2400 of the base frame of the apparatus generally shown in FIG. 43 and is fixed to the stage 2400 by vacuum suction.

In phases (D) to (E), the small balls B held and arranged on the arrangement baseplate 2010 fixed on the bonding stage 2400, are aligned with the inner leads 2020 of a film carrier (not shown). The alignment can be performed by utilizing the alignment mechanism of the base frame. After the alignment, the balls B are simultaneously bonded or transferred to the inner leads 2020. The bonding can be performed by utilizing the bonding mechanism of the base frame or inner lead bonder or the like.

Figure 46:
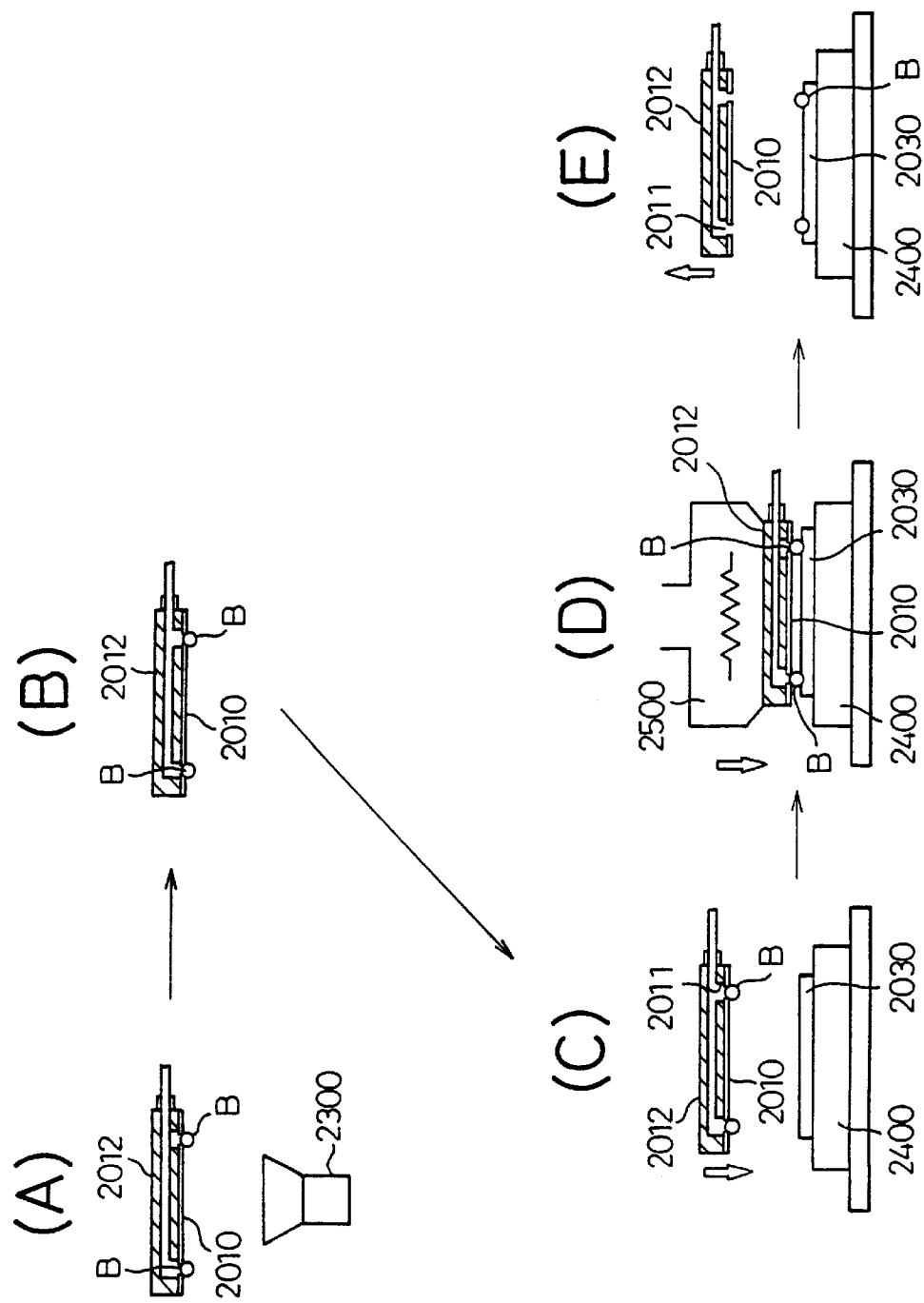
FIG. 46 schematically illustrates, in a series of cross-sectional views, an operation sequence for bonding small balls to the electrode pads of a semiconductor chip in the apparatus shown in FIG. 43, according to the third aspect.

FIG. 46 schematically illustrates an operation sequence for simultaneously bonding the small balls B to the electrode pads of an IC chip. A ball recognition phase (A) is performed in the same manner as in phase (A) of FIG. 45.

In phase (B), the head 2012 is not turned upside down but maintained in the initial direction.

In phase (C), an IC chip 2030 is placed on the bonding stage 2400. The arrangement head 2012 is lowered until the balls B are brought into contact with electrode pads (not shown) of the chip 2030.

In phases (D) to (E), the head 2012 is pressed downward by a heating tool 2500 against the electrode pads to bond the balls B to the electrode pads.

The excess small ball removing process and apparatus according to the third aspect of the present invention is advantageously utilized in the process of forming small ball bumps on electrode pads of a printed circuit board in the following manner.

The printed circuit board which has been brought into condition for mounting thereon QFPs, TSOPs, TCPs, etc., has electrode pads plated or printed with a solder. For example, a multiple-pin package having outer leads arranged at a pitch of 0.3 mm or less is mounted in a small area. This mounting cannot substantially be achieved by the conventional leveler process and the other conventional processes have many problems in cost and product quality.

Figure 47:
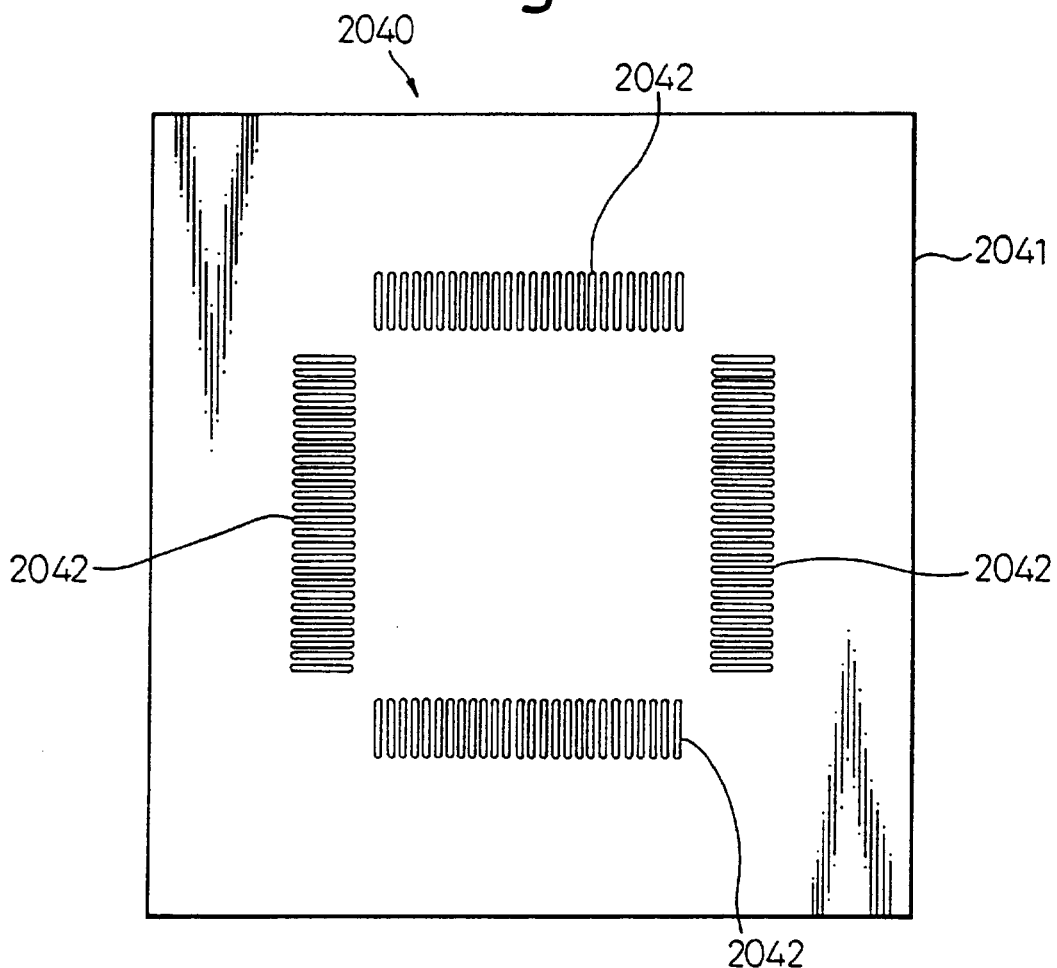
FIG. 47 is a plan view showing a printed circuit board to which the process and apparatus of the present invention is applicable.
Figure 48:
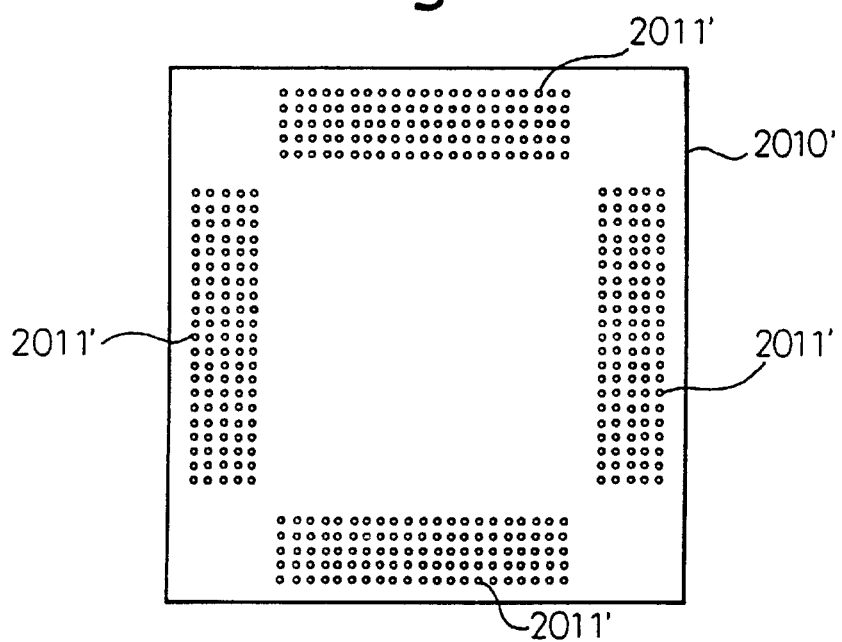
FIG. 48 is a plan view showing an arrangement baseplate for use in forming ball bumps on the printed circuit board shown in FIG. 47.

FIG. 47 shows a printed circuit board 2040 having a base board 2041 on which electrode pads 2042 are arranged at a selected pitch (for example, 0.15 mm) and in a selective pattern. FIG. 48 shows an arrangement baseplate 2010' having numerous attraction openings 2011' corresponding to the pads 2042. The attraction openings 2011' are formed in accordance with the pitch and the length (for example, 2.0 mm) of the pads 2042. In this example, the attraction openings 2042 has a diameter of 50 μm. For example, the arrangement baseplate 2010' is made of stainless steel or glass and has a thickness of 0.2 mm.

Referring to FIG. 49, in phase (A), a ball container vessel 2101 containing solder small balls B having a diameter of 70 μm, for example is set on a vibration generator 2102. The vessel 2101 is vibrated at a frequency of about 400 Hz to cause the balls B to jump up above the vessel 2101.

In phase (B), the head 2012' is lowered maintaining the baseplate 2010' directed downward, to attract the jumping small balls B to the attraction openings 2011' of the arrangement baseplate 2010'.

In phase (C), the head 2012' is then raised and the ultrasonic vibration element 2002 is operated through the control unit 2004 to apply an ultrasonic vibration to the baseplate 2010' so that excess small balls B' are instantaneously and thoroughly removed from the baseplate 2010' thereby ensuring that the small balls B are properly arranged on the arrangement baseplate 2010'.

FIG. 50 schematically illustrates an operation sequence for bonding solder small balls to electrode pads of a printed circuit board.

In phase (A), the ball recognition means 2300 recognizes a lack or an excess of the small balls B on the baseplate 2010'.

In phase (B), the baseplate 2010' is aligned with the printed circuit board 2040 fixed on the bonding stage 2400. It is to be noted that the electrode pads 2042 of the printed circuit board 2040 has a surface coating of a flux 2043 to improve wetting by solder in the later reflow step.

In phase (C), after the alignment, the head 2012' is lowered to the printed circuit board 2040 so that the small balls B are bonded or adhered to the pads 2042.

In phase (D), after the bonding of solder balls, the head 2012' is raised.

In phase (E), the printed circuit board 2040 is heat-treated to cause the solder balls to melt and flow down to the pads 2042, to provide a uniform solder coating on the pads 2042 over the printed circuit board 2040.

Thus, the excess small ball removal according to the present invention can be advantageously utilized in feeding solder in a controlled amount to electrode pads of the printed circuit board 2040.

The excess small ball removal according to the present invention is also advantageously utilized in feeding solder to a printed circuit board after a repair process in the following manner.

Figure 51A:
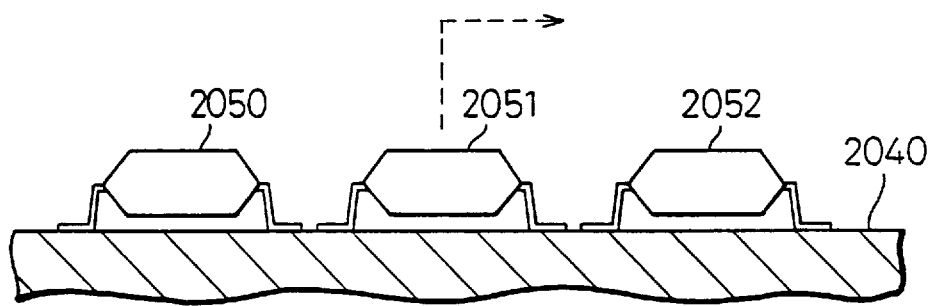
FIGS. 51(a) and 51(b) are cross-sectional views showing a repair process for semiconductor packages on a printed circuit board, in which the process of the present invention is utilized.
Figure 51B:
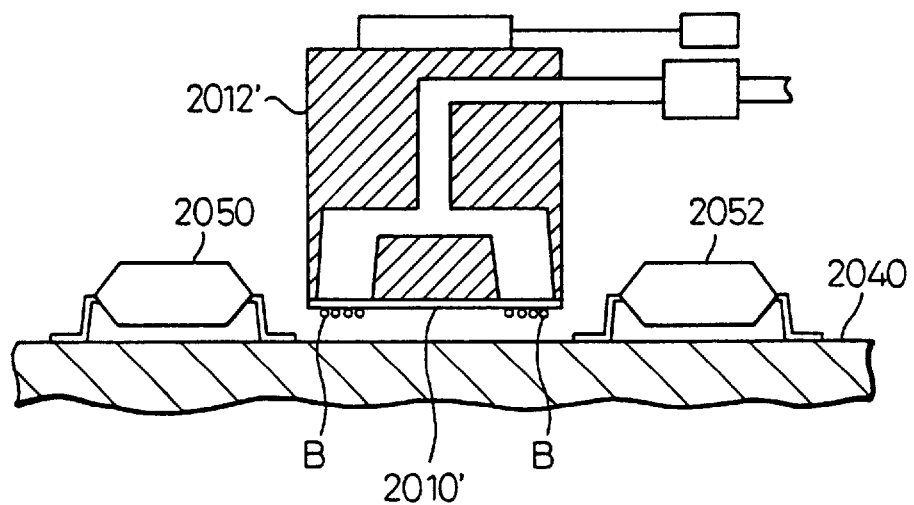

FIG. 51(*a*) shows (b) a printed circuit board 2040 on which semiconductor packages 2050, 2051, and 2052 are mounted. For example, the package 2051 is removed, a repair process is performed, and the solder remaining on the board 2040 is then removed. Thereafter, as shown in FIG. 51(*b*), solder is fed in a controlled amount to the space between the unremoved packages 2050 and 2052. Specifically, a head 2012', which holds an arrangement baseplate 2010' on which small solder balls B are held and arranged, is aligned with the space for providing a solder feed in a controlled amount.

The present invention is not limited to the examples described above but many modification and variation is possible without departing from the scope and spirit thereof. Although the examples use solder balls or metal balls to form ball bumps, the present invention can thoroughly remove excess balls from the baseplate by applying thereto an ultrasonic vibration when electroconductive rubber balls are used.

As herein described above, the third aspect of the present invention thoroughly removes excess balls from the baseplate for arranging the balls in a ball bonding process, by applying an ultrasonic vibration to the baseplate. For example, when small metal balls are used to form bumps, the small balls are properly arranged for bonding to inner leads of a film carrier or electrode pads of a semiconductor chip and thereby advantageously significantly improves the product quality and the productivity.

Most preferred examples according to the first, second and third aspects of the present invention will be described below.

EXAMPLE 4

In a most preferred embodiment of the present invention, ball bumps are formed in the following manner.

Jump up Small Balls (FIG. 2, phase (A))

A removable ball container vessel 11 containing small balls B is mounted on a vibration generator 12 such as a parts feeder.

A vibration of up to 1 kHz, typically 100 to 350 Hz, is applied to the vessel 11 at a small amplitude to cause the small balls B to jump up above the vessel 11.

Arrange Small Balls (FIG. 2, phase (B))

An arrangement baseplate 15 is held on the arrangement head 2013 in a manner such that the upper surface of the former is attracted to the lower surface of the latter by vacuum suction. The arrangement baseplate 15 has attraction openings 14 to attract the small balls B on the lower surface thereof. The openings 14 are smaller in diameter than the balls B and are arranged in positions corresponding to positions of electrode pads of one semiconductor chip (FIG. 14, w1). The arrangement head 13 has suction holes 22 and a suction groove 20, which separately effect vacuum suction to attract the baseplate 15 and vacuum suction to attract the small balls B through the attraction openings 14, respectively.

The arrangement head 13, on which the arrangement baseplate 15 is held, is lowered toward the vessel 11 above which the small balls B are jumping up.

The head 13 is vertically reciprocated at least once to promote selective attraction of the small balls B to the attraction openings 14. The stroke of this reciprocation is controlled in terms of 0.1 mm.

Remove Excess Balls (FIG. 2, phase (C))

During the arranging of the small balls on the baseplate 15, a vibration, typically of 35 to 45 kHz, is applied to the head 13 at a small amplitude to remove excess small balls B' adhered to the baseplate 15 and/or to the small balls B properly attracted to the openings 14. This vibration is conveniently provided by an ultrasonic vibration element 100 (FIG. 9) fixed to the upper surface of the arrangement head 13 with an adhesive agent.

Verify Arrangement (FIG. 12, phase (A))

An image recognition means 3 verifies that the attraction openings 14 each attracts one small ball B.

When a lack or an excess of the attracted balls B is recognized, the steps of arranging, removing and verifying are repeated.

Bonding (FIG. 12, phases (B) and (C))

One semiconductor chip 30 is mounted on the bonding stage 4. The small balls B held and arranged on the arrangement baseplate 15 are aligned with the corresponding electrode pads of the semiconductor chip 30 (phase (B)).

The arrangement head 13 (denoted by "113" in FIG. 12) is lowered toward the semiconductor chip 30 and the small balls B are bonded to the electrode pads by thermocompression. The head 13 may incorporate a heating and compressing means. The bonding stage 4 incorporates a heating means.

EXAMPLE 5

In another most preferred embodiment of the present invention, ball bumps are formed in the following manner.

Jump up Small Balls (FIG. 35, phase (A))

A removable ball container vessel 1016 containing small balls B is mounted on a vibration generator 1124 such as a parts feeder.

A vibration of up to 1 kHz is applied to the vessel 1016 at a small amplitude to cause the small balls B to jump up above the vessel 1016.

Arrange Small Balls (FIG. 35, phases (A) to (C))

In phase (A), a first arrangement baseplate 1112 is held on an arrangement head 1111 in a manner such that the upper surface of the former is attracted to the lower surface of the latter by vacuum suction. The arrangement baseplate 1112 has attraction openings 1113 to attract the small balls B on the lower surface thereof. The openings 1113 are smaller in diameter than the balls B and are arranged in positions as shown in FIG. 29 corresponding to positions of four sets of electrode pads of four semiconductor chips (FIG. 14, w4).

The arrangement head 1111 has suction holes 1115 and a suction groove 1120, which separately effect vacuum suction to attract the first arrangement baseplate 1112 and vacuum suction to attract the small balls B through the attraction openings 1113, respectively.

The arrangement head 1111, on which the arrangement baseplate 1112 is held, is lowered toward the vessel 1016 above which the small balls B are jumping up.

In phase (B), the head 1111 is vertically reciprocated at least once to promote selective attraction of the small balls B to the attraction openings 1113. The stroke of this reciprocation is controlled in terms of 0.1 mm.

In phase (C), during the arranging of the small balls on the first arrangement baseplate 1112, a vibration is applied to the head 1111 at a small amplitude to remove excess small balls B' adhered to the baseplate 1112 and/or to the small balls B properly attracted to the openings 1113. This vibration is conveniently provided by an ultrasonic vibration element 1126 fixed to the upper surface of the arrangement head 1111 with an adhesive agent.

Figure 18:
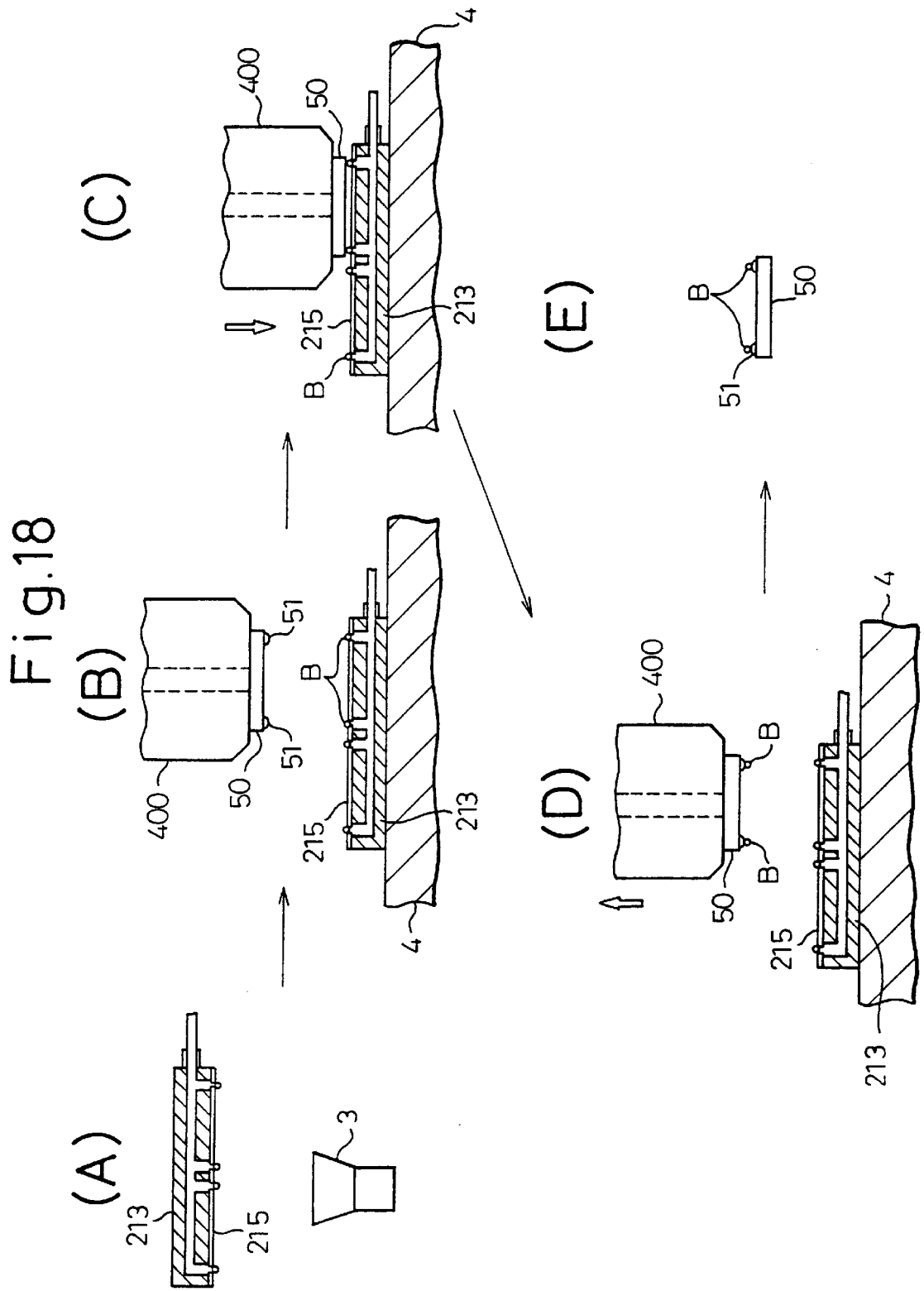
FIG. 18 schematically illustrates, in a series of cross-sectional views, an operation sequence for simultaneously bonding one set of small balls to one set of electrode pads of one semiconductor chip according to the third embodiment of the first aspect of the present invention.

Verify Arrangement (FIG. 18, phase (A))

An image recognition means such as that denoted by 1003 verifies that the attraction openings 1113 each attracts one small ball B.

When lack or excess of the attracted balls B is recognized, the steps of arranging, removing and verifying are repeated.

Pick up Arranged Balls (FIGS. 36, 37)

FIG. 37 shows a pickup assembly 1104 including a second arrangement baseplate 1142 held by a pickup head 1140 in such a manner that the upper surface of the former is attracted to the lower surface of the latter by vacuum suction. The second arrangement baseplate 1142 has attraction openings 1141 to attract the small balls B on the lower surface thereof. The openings 1141 are smaller in diameter than the balls B and are arranged in positions corresponding to positions of one set of electrode pads of one semiconductor chips (FIG. 14, w1).

As shown in FIG. 33, the arrangement head 1140 has suction holes 1115' and suction groove 1120', which separately effect vacuum suction to attract the second arrangement baseplate 1142 and vacuum suction to attract the small balls B through the attraction openings 1141, respectively.

In phase (A) of FIG. 36, the arrangement head 1111, on which the first arrangement baseplate 1112, is turned upside down and mounted on a pickup stage 1003. The pickup head 1104 is held above the first arrangement baseplate 1112 and the attraction openings 1141 of the second arrangement baseplate are aligned with the corresponding small balls B on the first arrangement baseplate 1112.

In phase (B), the above-mentioned one set of small balls B are attracted to the pickup head 1104.

Bonding (FIG. 38)

In phase (A) of FIG. 38, one semiconductor chip 1080 is mounted on the bonding stage 1006. The small balls B held and arranged on the second arrangement baseplate 1142 are aligned with the corresponding electrode pads of the semiconductor chip 1080.

In phase (B), the pickup head 1104 is lowered toward the semiconductor chip 1080 and the small balls B are bonded to the electrode pads by thermocompression. The pickup head 1104 may incorporate a heating and compressing means. The bonding stage 1006 incorporates a heating means.

We claim:

1. An apparatus for forming ball bumps for electrical connection to an integrated circuit, comprising:
   means for applying a vibration at a small amplitude to a vessel containing small balls of an electroconductive material to cause the small balls to jump up above the vessel;
   means for holding and arranging the small balls on an arrangement baseplate by attracting the jumping up small balls to attraction openings provided in the arrangement baseplate in positions corresponding to positions of at least one set of the electrode pads of one semiconductor chip;
   means for removing excess small balls adhered either to the arrangement baseplate or to the small balls attracted to the openings; and
   means for simultaneously bonding the small balls held and arranged on the arrangement baseplate to bonding spots arranged in positions corresponding to said positions of said at least one set of the electrode pads.

2. An apparatus according to claim 1, wherein the electroconductive material is a metal.

3. An apparatus according to claim 1, wherein the small balls have a diameter of 100 µm or less.

4. An apparatus according to claim 1, wherein the means for holding and arranging attracts the jumping up small balls to the attraction openings by vacuum suction.

5. An apparatus according to claim 1, wherein the means for holding and arranging comprises an arrangement head which holds the arrangement baseplate by a side opposite to a side on which the small balls are held and arranged.

6. An apparatus according to claim 5, wherein the arrangement head holds the arrangement baseplate by attracting the latter thereto by vacuum suction.

7. An apparatus according to claim 6, wherein the vacuum suction to attract the arrangement baseplate to the arrangement head and the vacuum suction to attract the small balls to the attraction openings are performed by a common vacuum suction system.

8. An apparatus according to claim 6, wherein the vacuum suction to attract the arrangement baseplate to the arrangement head and the vacuum suction to attract the small balls to the attraction openings are performed by separate vacuum suction systems which are separately controllable.

9. An apparatus according to claim 1, wherein the means for holding and arranging further comprises means for vertically reciprocating the arrangement baseplate at least once to promote selective attraction of the small balls to the attraction openings.

10. An apparatus according to claim 1, wherein the means for holding and arranging further comprises vibrating the arrangement baseplate at a small amplitude in a horizontal direction to prevent excess small balls from adhering to the arrangement baseplate.

11. An apparatus according to claim 1, wherein the means for removing is means for vibrating the arrangement baseplate.

12. An apparatus according to claim 11, wherein the means for vibrating is an ultrasonic vibrator.

13. An apparatus according to claim 1, which further comprises means for verifying that, after the removing and before the bonding, each one of the attraction openings attracts thereto one of the small balls of said at least one set.

14. An apparatus according to claim 1, wherein the means for bonding is adapted to bonding the small balls to inner leads of a film carrier, electrode pads of a semiconductor chip, electrode pads of a printed-circuit board, or electrode pads of a flexible circuit board.

15. An apparatus for forming ball bumps for electrical connection to an integrated circuit, comprising:
    means for providing a first number of sets of small balls of an electroconductive material arranged on a first arrangement baseplate in positions corresponding to positions of the first number of sets of the electrode pads of one semiconductor chip, the first number being at least one;
    means for simultaneously picking up a second number of sets of the small balls on a second arrangement baseplate by attracting the small balls to attraction openings provided in the second arrangement baseplate in positions corresponding to positions of the second number of sets of the electrode pads, the second number being not more than the first number, to hold and arrange the second number of sets of the small balls on the second arrangement baseplate in positions corresponding to their positions on the first arrangement baseplate; and
    means for simultaneously bonding the second number of sets of the small balls held and arranged on the second arrangement baseplate to bonding spots arranged in positions corresponding to positions of the second number of sets of the electrode pads.

16. An apparatus according to claim 15, wherein the means for providing the first number of sets of the small balls arranged on the first arrangement baseplate comprises:
    means for providing the first arrangement baseplate having attraction openings in positions corresponding to positions of the first number of sets of the electrode pads of the semiconductor chip;
    means for holding and arranging the small balls on the first arrangement baseplate, by lowering the first arrangement base plate with its side on which the small balls are held and arranged being directed downward into a vessel containing the small balls to attract the small balls to the attraction openings; and
    means for removing excess small balls adhered either to the first arrangement baseplate or to the small balls attracted to the attraction openings.

17. An apparatus according to claim 15, wherein the small balls are arranged on the first arrangement baseplate by the following means of:
    means for providing the first arrangement baseplate having attraction openings in positions corresponding to positions of the first number of sets of the electrode pads of the semiconductor chip;
    means for applying a vibration at a small amplitude to a vessel containing the small balls to cause the small balls to jump up above the vessel;
    means for holding and arranging the small balls on the first arrangement baseplate, by lowering the first arrangement baseplate with its side on which the small balls are held and arranged being directed downward into the vessel to attract the jumping up small balls to the attraction openings; and means for removing excess small balls adhered either to the first arrangement baseplate or to the small balls attracted to the attraction openings.

18. An apparatus according to claim 15, which further comprises means for verifying that the small balls, before being picked up, are held and arranged on the first arrangement baseplate in positions corresponding to positions of the first number of sets of the electrode pads.

19. An apparatus according to claim 15, wherein the electroconductive material is a metal.

20. An apparatus according to claim 15, wherein the small balls have a diameter of 100 $\mu$m or less.

21. An apparatus according to claim 16, wherein the means for holding and arranging includes a vacuum suction system to attract the small balls to the attraction openings.

22. An apparatus according to claim 16, wherein the first and second arrangement baseplates are held on first and second arrangement heads, respectively, by their side opposite to a side on which the small balls are held and arranged.

23. An apparatus according to claim 22, wherein the first and second arrangement baseplates are held on the first and second arrangement heads, respectively, by being attracted thereto by vacuum suction.

24. An apparatus according to claim 23, wherein, in at least one of the first and second arrangement baseplates, the vacuum suction to attract the arrangement baseplate to the arrangement head and the vacuum suction to attract the small balls to the attraction openings are performed by a common vacuum suction system.

25. An apparatus according to claim 23, wherein, in at least one of the first and second arrangement baseplates, the vacuum suction to attract the arrangement baseplate to the arrangement head and the vacuum suction to attract the small balls to the attraction openings are performed by separate vacuum suction systems which are separately controllable.

26. An apparatus according to claim 16, wherein the means for holding and arranging further comprises means for vertically reciprocating the arrangement baseplate at least once to promote selective attraction of the small balls to the attraction openings.

27. An apparatus according to claim 16, wherein the means for holding and arranging further comprises means for vibrating the arrangement baseplate at a small amplitude in a horizontal direction to prevent excess small balls from adhering to the arrangement baseplate.

28. An apparatus according to claim 16, wherein the means for removing is means for vibrating the first arrangement baseplate.

29. An apparatus according to claim 27, wherein the means for vibrating is an ultrasonic vibrator.

30. An apparatus according to claim 15, wherein the means for simultaneously bonding is adapted to bonding the small balls to inner leads of a film carrier, electrode pads of a semiconductor chip, electrode pads of a printed-circuit board, or electrode pads of a flexible circuit board.

* * * * *